(12) United States Patent
Katayama

(10) Patent No.: US 7,515,134 B2
(45) Date of Patent: Apr. 7, 2009

(54) BIDIRECTIONAL SHIFT REGISTER

(75) Inventor: Shigenori Katayama, Azumino (JP)

(73) Assignee: Seiko Epson Corporation (JP)

( * ) Notice: Subject to any disclaimer, the term of this patent is extended or adjusted under 35 U.S.C. 154(b) by 639 days.

(21) Appl. No.: 11/326,568

(22) Filed: Jan. 5, 2006

(65) Prior Publication Data
US 2006/0170643 A1     Aug. 3, 2006

(30) Foreign Application Priority Data
Feb. 1, 2005    (JP)  ............................ 2005-024964

(51) Int. Cl.
*G09G 3/36*     (2006.01)
(52) U.S. Cl. .......................... 345/100; 345/87
(58) Field of Classification Search .................... 345/77, 345/81, 87–100, 204, 208–214
See application file for complete search history.

(56) References Cited

U.S. PATENT DOCUMENTS 5,872,563 A  *  2/1999   Asada ......................... 345/212
6,670,943 B1  *  12/2003   Ishii et al. .................... 345/100

\* cited by examiner

*Primary Examiner*—Richard Hjerpe
*Assistant Examiner*—Mansour M Said
(74) *Attorney, Agent, or Firm*—Harness, Dickey & Pierce, P.L.C.

(57) ABSTRACT

A bidirectional shift register includes multi-stages of shift register unit circuits that transmit a start pulse in a direction indicated by a logical level of a transmission direction control signal. Each of the shift register unit circuits has a first transfer gate that transmits the start pulse in synchronization with one of a clock signal and an inverted clock signal, which is obtained by inverting the clock signal, a second transfer gate that transmits the start pulse in synchronization with the other signal of the clock signal and the inverted clock signal, a first logical circuit that inverts an input signal and outputs the inverted signal, and first and second clocked inverters that are exclusively valid according to the logical level of the transmission direction control signal. An output terminal of the first logical circuit is connected to input terminals of the first and second clocked inverters, and output terminals of the first and second clocked inverters are connected to an input terminal of the first logical circuit through the first and second transfer gates.

3 Claims, 15 Drawing Sheets

BIDIRECTIONAL SHIFT REGISTER

The entire disclosure of Japanese Application No. 2005-02496, filed Feb. 1, 2005 is expressly incorporated by reference herein.

BACKGROUND

1. Technical Field

The present invention relates to a bidirectional shift register which is used for, for example, a data line driving circuit or a scanning line driving circuit of liquid crystal, to an electro-optical device using such a driving circuit, and to an electronic apparatus.

2. Related Art

In the related art, as electro-optical devices in which an image is displayed in an image display region, liquid crystal display devices have been known. The liquid crystal display device has a data line driving circuit or a scanning line driving circuit, which supplies data line signals or scanning line signals to data lines or scanning lines wired in the image display region with a predetermined timing, for example. Such a data line driving circuit or a scanning line driving circuit has a bidirectional shift register that output sampling signals, such that image signals are written into respective pixels based on the sampling signals.

1: Configuration of Bidirectional Shift Register according to the Related Art

FIG. 14 is a circuit diagram of a part of a bidirectional shift register 100 constituted in a positive logic according to the related art.

The bidirectional shift register 100 includes n shift register unit circuits A1, A2, ..., An, each having a plurality of thin film transistors, n−1 logical arithmetic unit circuits B1, B2, ..., B(n−1). Here, n is a natural number of two or more.

Hereinafter, the shift register unit circuits A1 to A4 and the logical arithmetic unit circuits B1 to B3 will be described in detail. Of course, other shift register unit circuits A5 to An or logical arithmetic unit circuits B4 to B(n−1) have the same configuration as those of the shift register unit circuits A1 to A4 or those of the logical arithmetic unit circuits B1 to B3.

To each of the shift register unit circuits A1 to A4, a first clock signal CK1, a first inverted clock signal CK1B, a second clock signal CK2, and a second inverted clock signal CK2B are supplied. The shift register unit circuits A1 to A4 transmit a transmission start pulse ST in synchronization with the clock signals CK1, CK1B, CK2, and CK2B and outputs output signals P1 to P4, respectively. Here, to each of the shift register unit circuits A1 to A4, a transmission direction control signal DIR and an inverted transmission direction control signal DIRB are supplied, such that the transmission direction is controlled.

The logical arithmetic unit circuits B1 to B3 generate sampling signals Sm1 to Sm3 on the basis of the output signals P1 to P4 of the shift register unit circuits A1 to A4, respectively.

Specifically, the logical arithmetic unit circuit B is an AND circuit that calculates a positive logical product corresponding to two-stages of the shift register unit circuits A. That is, to the logical arithmetic unit circuit Bm (where m is a natural number of n−1 or less), the output signal Pm from the shift register unit circuit Am and the output signal P(m+1) from the shift register unit circuit Am+1 are input. The logical arithmetic unit circuit Bm calculates the logical product of the output signal Pm and the output signal P(m+1) and outputs the logical product as the sampling signal 5 mm.

Moreover, when the bidirectional shift register is constituted in a negative logic, the logical arithmetic unit circuit B is a NOR circuit that calculates a negative logical product corresponding to the shift register unit circuits A.

Each of the shift register unit circuits A1 to A4 has first and second clocked inverters 101 and 102, an inverter 103, and first and second transfer gates 104 and 105, for example. Output terminals of the first and second clocked inverters 101 and 102 are connected to an input terminal of the inverter 103, and an output terminal of the inverter 103 is connected to input terminals of the first and second clocked inverters 101 and 102 through the first and second transfer gates 104 and 105 (see JP-A-11-176186).

The first clock signal CK1 and the first inverted clock signal CK1B or the second clock signal CK2 and the second inverted clock signal CK2B are supplied to a control terminal of the first clocked inverter 101, and the others are supplied to a control terminal of the second clocked inverter 102.

The transmission direction control signal DIR is supplied to a control terminal of the first transfer gate 104, and the inverted transmission direction control signal DIRB is supplied to a control terminal of the second transfer gate 105. Accordingly, only one of the first and second transfer gates 104 and 105 is turned on, and then the transmission direction of the transmission start pulse ST is determined. Here, it is assumed that the logical level of the inverted transmission direction control signal DIRB is in the H level (high level). That is, all the first transfer gates 104 are in a high impedance state, and all the second transfer gates are in an ON state, such that the transmission start pulse ST is transmitted from the left side of FIG. 14 to the right side.

Next, the operations of the shift register unit circuits A1 to A4 will be described.

It is assumed that the transmission start pulse ST, which is in an active state at the time of the H level, is input, the first clock signal CK1 is in the H level, and the second clock signal CK2 is in the L level.

In this state, in the shift register unit circuit A1, the first clocked inverter 101 operates as an inverter having the input of the H level and the output of the L level (low level), and the output of the output signal P1 is in the H level.

On the other hand, in the shift register unit circuit A1, the second clocked inverter 102 is in the high impedance state, and, in the shift register unit circuit A2, the first clocked inverter 101 is in the high impedance state in which its input is in the H level.

From this state, if the first clock signal CK1 becomes the L level and the second clock signal CK2 becomes the H level, in the shift register unit circuit A1, the first clocked inverter 101 changes from the operation state as the inverter having the input of the H level and the output of the L level to the high impedance state. Simultaneously, the second clocked inverter 102 changes from the high impedance state to the operation state as the inverter having the input of the H level and the output of the L level. Therefore, in the shift register unit circuit A1, a latch circuit is constituted by the second clocked inverter 102 and the inverter 103, and the output of the output signal P1 still maintains the H level.

On the other hand, in the shift register unit circuit A2, the first clocked inverter 101 changes from the high impedance state, in which its input is in the H level, to the operation state as the inverter having the input of the H level and the output of the L level, and the output of the output signal P2 becomes the H level.

Subsequently, from this state, if the second clock signal CK2 becomes the L level and the first clock signal CK1 becomes the H level, in the shift register unit circuit A1, the first clocked inverter 101 changes from the high impedance state to the operation state as an inverter having the input of the L level and the output of the H level. Simultaneously, the second clocked inverter 102 changes from the operation state as the inverter having the input of the H level and the output of the L level to the high impedance state. Therefore, the output of the output signal P1 becomes the L level.

On the other hand, in the shift register unit circuit A2, a latch circuit is constituted, and then the output of the output signal P2 still maintains the H level. Further, in the shift register unit circuit A3, the output of the output signal P3 changes from the L level to the H level.

As such, the timing at which each of the output signals P1 to Pn in the respective shift register unit circuits A1 to An changes from the L level to the H level is determined by the timing at which the first clocked inverter 101 changes from the high impedance state, in which its input is in the H level, to the ON state.

Further, the timing at which each of the output signals P1 to Pn changes from the H level to the L level is determined by the timing at which the first clocked inverter 101 changes from the high impedance state, in which its input is in the L level, to the ON state.

Next, when the bidirectional shift register is constituted in the negative logic, the operations of the shift register unit circuits A1 to A4 will be described.

It is assumed that the transmission start pulse ST, which is in an active state at the time of the L level, is input, the first clock signal CK1 is in the H level, and the second clock signal CK2 is in the L level.

In this state, in the shift register unit circuit A1, the first clocked inverter 101 operates as an inverter having the input of the L level and the output of the H level (high level), and the output of the output signal P1 is in the L level.

On the other hand, in the shift register unit circuit A1, the second clocked inverter 102 is in the high impedance state, and, in the shift register unit circuit A2, the first clocked inverter 101 is also in the high impedance state, in which its input is in the L level.

From this state, if the first clock signal CK1 becomes the L level and the second clock signal CK2 becomes the H level, in the shift register unit circuit A1, the first clocked inverter 101 changes from the operation state as the inverter having the input of the L level and the output of the H level to the high impedance state. Simultaneously, the second clocked inverter 102 changes from the high impedance state to the operation state as the inverter having the input of the L level and the output of the H level. Therefore, in the shift register unit circuit A1, a latch circuit is constituted by the second clocked inverter 102 and the inverter 103, and the output of the output signal P1 still maintains the L level.

On the other hand, in the shift register unit circuit A2, the first clocked inverter 101 changes from the high impedance state, in which its input is in the L level, to the operation state as the inverter having the input of the L level and the output of the H level, and the output of the output signal P2 becomes the L level.

Subsequently, from this state, if the second clock signal CK2 becomes the L level and the first clock signal CK1 becomes the H level, in the shift register unit circuit A1, the first clocked inverter 101 changes from the high impedance state to the operation state as an inverter having the input of the H level and the output of the L level. Simultaneously, the second clocked inverter 102 changes from the operation state as the inverter having the input of the L level and the output of the H level to the high impedance state. Therefore, the output of the output signal P1 becomes the H level.

On the other hand, in the shift register unit circuit A2, a latch circuit is constituted, and the output of the output signal P2 still maintains the L level. Further, in the shift register unit circuit A3, the output of the output signal P3 changes from the H level to the L level.

As such, the timing at which each of the output signals P1 to Pn in the respective shift register unit circuits A1 to An changes from the H level to the L level is determined by the timing at which the first clocked inverter 101 changes the high impedance state, in which its input is in the L level, to the ON state.

Further, the timing at which each of the output signals P1 to Pn changes from the L level to the H level is determined by the timing at which the first clocked inverter 101 changes the high impedance state, in which its input is in the H level, to the ON state.

1-1: Configuration of Inverter

The inverter constituting each of the above-described shift register unit circuits A1 to An has the following configuration.

FIG. 15 is a circuit diagram of the inverter at a transistor level.

The inverter is a CMOS type in which a p-channel MOS transistor 111 (hereinafter, referred to as pMOS) and an n-channel MOS transistor 112 (hereinafter, referred to as nMOS) are combined. Specifically, gates of the pMOS 111 and the nMOS 112 are connected to an input terminal, and drains of the pMOS 111 and the nMOS 112 are connected to an output terminal.

In this inverter, when an input is in the H level, the pMOS 111 is turned off and the nMOS 112 is turned on. If doing so, a voltage on the nMOS 112 appears on the output terminal, and thus an output becomes the L level. On the other hand, when the input is in the L level, the nMOS 112 is turned off and the pMOS 111 is turned on. If doing so, a voltage on the PMOS 111 appears on the output terminal, and thus the output becomes the H level.

1-2: Configuration of Clocked Inverter Operating by First Clock Signal

The clocked inverter which constitutes each of the above-described transistor unit circuits A1 to An and which operates when the first clock signal CK1 is in the H level has the following configuration.

FIG. 16 is a circuit diagram of the clocked inverter, which operates by the first clock signal CK1, at a transistor level.

The clocked inverter is constituted by connecting two pMOS and two nMOS in series. Specifically, a second pMOS 113, a first pMOS 111, a first nMOS 112, and a second nMOS 114 are connected in that order. The first pMOS 111 and the first nMOS 112 have the same configuration as that of the above-described inverter. Further, since the clocked inverter operates when the first clock signal CK1 is in the H level, the first inverted clock signal CK1B is supplied to the second pMOS 113, and the first clock signal CK1 is supplied to the second nMOS 114.

The operation of the clocked inverter, which operates by the first clock signal CK1, is divided into four modes described below.

(1-1) When the input level is H, the second nMOS 114 becomes the ON state by the first clock signal CK1, and the clocked inverter changes from the high impedance state to the ON state.

(1-2) When the input level is H, the second nMOS 114 becomes the OFF state by the first clock signal CK1, and the clocked inverter changes from the ON state to the high impedance state.

(1-3) When the input level is L, the second pMOS 113 becomes the ON state by the first inverted clock signal CK1B, and the clocked inverter changes from the high impedance state to the ON state.

(1-4) When the input level is L, the second pMOS 113 becomes the OFF state by the first inverted clock signal CK1B, and the clocked inverter changes from the ON state to the high impedance state.

1-3: Configuration of Clocked Inverter Operating by Second Clock Signal

FIG. 17 is a circuit diagram of the clocked inverter, which operates by the second clock signal CK2, at a transistor level.

The clocked inverter substantially has the same configuration as that of the clocked inverter, which operates by the first clock signal CK1, but operates if the second clock signal CK2 becomes the H level. Accordingly, the second inverted clock signal CK2B is supplied to the second pMOS 113, and the second clock signal CK2 is supplied to the second nMOS 114.

The operation of the clocked inverter, which operates by the second clock signal CK2 is divided into four modes described below.

(2-1) When the input level is H, the second nMOS 114 becomes the ON state by the second clock signal CK2, and the clocked inverter changes from the high impedance state to the ON state.

(2-2) When the input level is H, the second nMOS 114 becomes the OFF state by the second clock signal CK2, and the clocked inverter changes from the ON state to the high impedance state.

(2-3) When the input level is L, the second PMOS 113 becomes the ON state by the second inverted clock signal CK2B, and the clocked inverter changes from the high impedance state to the ON state.

(2-4) When the input level is L, the second pMOS 113 becomes the OFF state by the second inverted clock signal CK2B, and the clocked inverter changes from the ON state to the high impedance state.

1-4: Inverted Clock Signal Generating Circuit

Specifically, the inverted clock signals, which are supplied to the above-described clocked inverters, are generated by an inverted clock signal generating circuit 120 to be described below.

FIG. 18 is a circuit diagram of the inverted clock signal generating circuit 120.

The inverted clock signal generating circuit has an inverter 121, and capacitors 122 and 123 that are parasitic on wiring lines of input and output sides. The inverter 121 has the same configuration as that of the inverter shown in FIG. 15.

If the clock signals CK1 and CK2 are supplied to the inverter 121, the clock signals CK1 and CK2 are inverted by the inverter 121, such that the inverted clock signals CK1B and CK2B are obtained.

By the way, in the pMOS and the nMOS, there is the difference in hole mobility and electron mobility, and thus the pMOS and the nMOS have different voltage levels of the ON/OFF operation, that is, the threshold values.

Accordingly, the inverted clock signals CK1B and CK2B are generated by use of the inverted clock signal generating circuit shown in FIG. 18. The inverted clock signals CK1B and CK2B have delay time Td with respect to the clock signals CK1 and CK2, respectively, as shown in FIGS. 19 and 20.

That is, even when the clock signals CK1 and CK2 start to change from the H level to the L level, there is no case in which the pMOS and the nMOS constituting the inverter are immediately turned on and off, respectively. Specifically, at a level decreased by a constant voltage, the pMOS is turned on with a timing earlier than a timing at which the nMOS is turned off. If doing so, the voltage on the pMOS appears on the output terminal, and then the inverted clock signals CK1B and CK2B start to change from the L level to the H level.

Further, even when the clock signals CK1 and CK2 start to change from the L level to the H level, there is no case in which the pMOS and the nMOS constituting the inverter are immediately turned off and on, respectively. Then, at a level increased by a constant voltage, the voltage on the pMOS appears on the output terminal until the pMOS is turned off, and the inverted clock signals CK1B and CK2B maintain the H level.

Accordingly, the delay time Td is present between a rising edge of the clock signal CK1 or CK2 and a rising edge of the inverted clock signal CK1B or CK2B. Further, the delay time Td is present between a falling edge of the clock signal CK1 or CK2 and a falling edge of the inverted clock signal CK1B or CK2B. Here, the H-level periods of the clock signals CK1 and CK2 are set so as not to overlap each other.

1-5: Influence of Clock Signal and Inverted Clock Signal on Output Signal

The clock signals CK1 and CK2, and the inverted clock signals CK1B and CK2B having delay time Td with respect to the clock signals CK1 and CK2 are supplied to the bidirectional shift register 100.

FIG. 19 is a timing chart when the bidirectional shift register is constituted in a positive logic.

In an odd-numbered shift register unit circuit A of the shift register unit circuits A1 to An, when the first clock signal CK1 becomes the H level, the input of the first clocked inverter 101 changes from the high impedance state of the H level to the ON state. Accordingly, at the time T1A or T3A, an odd-numbered output signal P changes from the L level to the H level when the second nMOS 114 becomes the ON state by the first clock signal CK1 (1-1).

On the other hand, in the odd-numbered shift register unit circuit A, when the first clock signal CK1 becomes the H level, the input of the first clocked inverter 101 changes from the high impedance state of the L level to the ON state. Accordingly, at the time T4A or T7A, the odd-numbered output signal P changes from the H level to the L level when the second pMOS 113 becomes the ON state by the first inverted clock signal CKLB (1-3).

Further, in an even-numbered shift register unit circuit A of the shift register unit circuits A1 to An, when the second clock signal CK2 becomes the H level, the input of the first clocked inverter 101 changes from the high impedance state of the H level to the ON state. Accordingly, at the time T2A or T5A, an even-numbered output signal P changes from the L level to the H level when the second nMOS 114 becomes the ON state by the second clock signal CK2 (2-1).

On the other hand, in the even-numbered shift register unit circuit A, when the second clock signal CK2 becomes the H level, the input of the first clocked inverter 101 changes from the high impedance state of the L level to the ON state. Accordingly, at the time T6A or T8A, the even-numbered output signal P changes from the H level to the L level when the second pMOS 113 becomes the ON state by the second inverted clock signal CK2B (2-3).

Therefore, when the bidirectional shift register is constituted in the positive logic, the pulse width of each of the output signals P becomes Tp+Td.

FIG. 20 is a timing chart when the bidirectional shift register is constituted in a negative logic.

In the odd-numbered shift register unit circuit A of the shift register unit circuits A1 to An, when the first clock signal CK1 becomes the H level, the input of the first clocked inverter 101 changes from the high impedance state of the L level to the ON state. Accordingly, at the time T1B or T4B, the odd-numbered output signal P changes from the H level to the L level when the second pMOS 113 becomes the ON state by the first inverted clock signal CK1B (1-3).

On the other hand, in the odd-numbered shift register unit circuit A, when the first clock signal CK1 becomes the H level, the input of the first clocked inverter 101 changes from the high impedance state of the H level to the ON state. Accordingly, at the time T3B or T7B, the odd-numbered output signal P changes from the L level to the H level when the second nMOS 114 becomes the ON state by the first clock signal CK1 (1-1).

Further, in the even-numbered shift register unit circuit A of the shift register unit circuits A1 to An, when the second clock signal CK2 becomes the H level, the input of the first clocked inverter 101 changes from the high impedance state of the L level to the ON state. Accordingly, at the time T2B or T6B, the even-numbered output signal P changes from the H level to the L level when the second pMOS 113 becomes the ON state by the second inverted clock signal CK2B (2-3).

On the other hand, in the even-numbered shift register unit circuit A, when the second clock signal becomes the H level, the input of the first clocked inverter 101 changes from the high impedance state of the H level to the ON state. Accordingly, at the time T5B or T8B, the even-numbered output signal P changes from the L level to the H level when the second nMOS 114 becomes the ON state by the second clock signal CK2 (2-1).

Therefore, when the bidirectional shift register is constituted in the negative logic, the pulse width of each of the output signals P becomes Tp−Td.

Then, the pulse widths of the output signals P in the positive-logic and negative-logic bidirectional shift registers differ from each other by 2Td. For this reason, if the above-described bidirectional shift register is used as, for example, a data line driving circuit, the change in pulse width of the output signals needs to be considered at the time of the change of design, and design working takes much time.

SUMMARY

An advantage of some aspects of the invention is that it provides a bidirectional shift register which equalizes the pulse width of an output signal when the bidirectional shift register is constituted in a positive logic and the pulse width of an output signal when the bidirectional shift register is constituted in a negative logic.

According to an aspect of the invention, a bidirectional shift register includes multi-stages of shift register unit circuits that transmit a start pulse in a direction indicated by a logical level of a transmission direction control signal. Each of the shift register unit circuits has a first transfer gate that transmits the start pulse in synchronization with one of a clock signal and an inverted clock signal, which is obtained by inverting the clock signal, a second transfer gate that transmits the start pulse in synchronization with the other signal of the clock signal and the inverted clock signal, a first logical circuit that inverts an input signal and outputs the inverted signal, and first and second clocked inverters that are exclusively valid according to the logical level of the transmission direction control signal. An output terminal of the first logical circuit is connected to input terminals of the first and second clocked inverters, and output terminals of the first and second clocked inverters are connected to an input terminal of the first logical circuit through the first and second transfer gates.

As described above, in the related art, the timing for transmitting a start pulse is controlled by a clocked inverter. In the clocked inverter, the timing at which a high impedance state changes to an ON state is controlled by a pMOS or an nMOS according to the level of an input signal. For this reason, the pulse width of an output signal from a shift register unit circuit when the bidirectional shift register is constituted in a positive logic is different from the pulse width of an output signal from the shift register unit circuit when the bidirectional shift register is constituted in a negative logic.

In accordance with the aspect of the invention, the timing for transmitting the start pulse is controlled by the transfer gates. Accordingly, the timing at which the high impedance state changes to the ON state is controlled by a pMOS or an nMOS, which operates with an earlier timing, regardless of the level of the input signal. Therefore, when the bidirectional shift register is constituted in the positive logic or the negative logic, the pulse width of the output signal from each shift register unit circuit is equalized. As a result, at the time of the change of design, the change in pulse width of the output signal does not need to be considered, and thus design working can be rapidly performed.

Further, the inverter or the clocked inverter that inverts the input signal and outputs the inverted signal has a structure in which power consumes, unlike the transfer gate. In the related art, of five circuit elements constituting each shift register unit circuit, two clocked inverters, one inverter, and one transfer gate operate. Accordingly, the number of circuit elements in which power consumes is three. In contrast, according to the aspect of the invention, of five circuit elements constituting each shift register unit circuit, two transfer gates, the first logical circuit, and one clocked inverter operate. Accordingly, the number of circuit elements in which power consumes is two. Therefore, power consumption can be reduced, as compared with the related art shift register.

The bidirectional shift register according to the aspect of the invention may further include a reset circuit that outputs a reset signal. Here, it is preferable that the first logical circuit be a NOR circuit that inverts a signal output from the first or second transfer gate and the reset signal and calculates a logical sum of the inverted signals.

In the related art, an initial state of liquid crystal is unstable, and thus a variation in initial display state of each pixel occurs. However, according to the above-described configuration, the start pulse and the reset signal are set to be in the active state at the time of the H level, and the reset signal is input to the first logical circuit, such that the initial states of all the shift register unit circuits can be easily equalized.

The bidirectional shift register according to the aspect of the invention may further include a reset circuit that outputs a reset signal. Here, it is preferable that the first logical circuit be a NAND circuit that inverts a signal output from the first or second transfer gate and the reset signal and calculates a logical product of the inverted signals.

In the related art, the initial state of liquid crystal is unstable, and thus the variation in initial display state of each pixel occurs. However, according to the above-described configuration, the start pulse and the reset signal are set to be the active state at the time of the L level, and the reset signal is input to the first logical circuit, such that the initial states of all the shift register unit circuits can be easily equalized.

BRIEF DESCRIPTION OF THE DRAWINGS

The invention will be described with reference to the accompanying drawings, wherein like numbers reference like elements.

DESCRIPTION OF EXEMPLARY EMBODIMENTS

2: Overall Configuration of Electro-Optical Device

Figure 1:
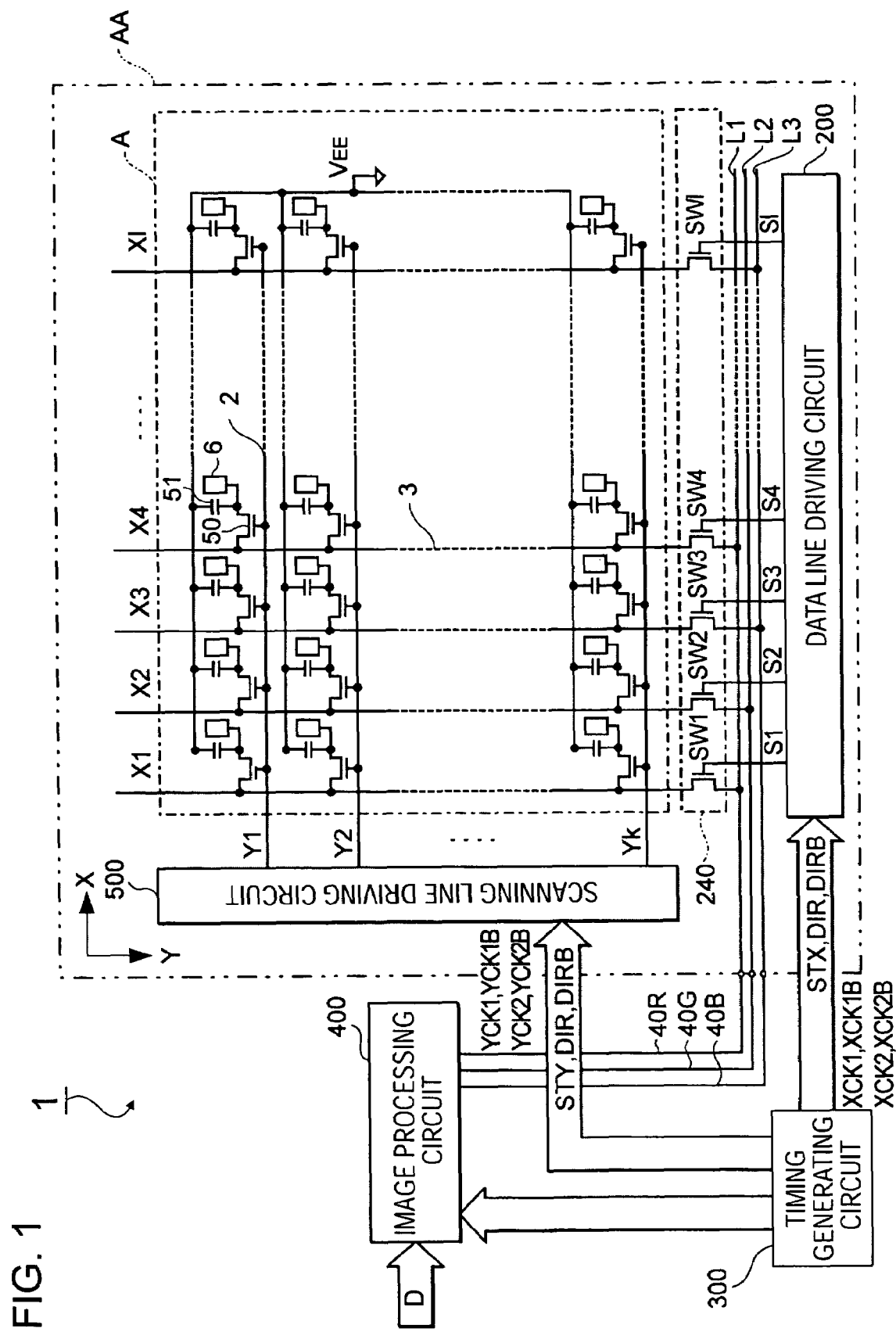
FIG. 1 is a block diagram showing the overall configuration of an electro-optical device having a data line driving circuit, to which a shift register according to an embodiment of the invention is applied.

FIG. 1 is a block diagram showing the overall configuration of an electro-optical device 1, to which a data line driving circuit 200 as a bidirectional shift register according to the present embodiment is applied.

First, the electro-optical device 1 uses liquid crystal as an electro-optical material. The electro-optical device 1 primarily has a liquid crystal panel AA. The liquid crystal panel AA has an element substrate, on which thin film transistors (hereinafter, referred to as 'TFTs') are formed as switching elements, a counter substrate that is disposed to face the element substrate by a predetermined gap, and liquid crystal that is provided between the element substrate and the counter substrate.

The electro-optical device 1 has a timing generating circuit 300 and an image processing circuit 400, in addition to the liquid crystal panel AA. On the element substrate of the liquid crystal panel AA, an image display region A, a scanning line driving circuit 500, a data line driving circuit 200, a sampling circuit 240, and image signal supply lines L1 to L3 are formed.

Input image data D to be supplied to the electro-optical device 1 is in a format of three parallel bits. The timing generating circuit 300 generates a first Y clock signal YCK1, a first inverted Y clock signal YCK1B, a second Y clock signal YCK2, a second inverted Y clock signal YCK2B, a first X clock signal XCK1, a first inverted X clock signal XCK1B, a second X clock signal XCK2, a second inverted X clock signal XCK2B, a Y transmission start pulse STY, an X transmission start pulse STX, a transmission direction control signal DIR, and an inverted transmission direction control signal DIRB in synchronization with input image data D, and supplies them to the scanning line driving circuit 500 and the data line driving circuit 200. Further, the timing generating circuit 300 generates and outputs various timing signals for controlling the image processing circuit 400.

Here, the first Y clock signal YCK1 and the second Y clock signal YCK2 are signals for specifying periods, in each of which a scanning line 2 is selected. The first inverted Y clock signal YCK1B and the second inverted Y clock signal YCK2B are obtained by inverting the logical levels of the first Y clock signal YCK1 and the second Y clock signal YCK2, respectively. The first X clock signal XCK1 and the second X clock signal XCK2 are signals for specifying periods, in each of which data lines 3 are selected. The first inverted X clock signal XCK1B and the second inverted X clock signal XCK2B are obtained by inverting the logical levels of the first X clock signal XCK1 and the second X clock signal XCK2, respectively. Further, the Y transmission start pulse STY is a pulse for indicating the start of selection of the scanning lines 2, and the X transmission start pulse STX is a pulse for instructing the start of selection of the data lines 3.

In addition, the transmission direction control signal DIR is a signal for indicating selection sequences of the scanning lines 2 and the data lines 3. Specifically, when the logical level of the transmission direction control signal DIR is in the H level, the transmission direction control signal DIR indicates that the respective scanning lines 2 are sequentially selected from the top to the bottom and the respective data lines 3 are selected from the left to the right. On the other hand, when the transmission direction control signal DIR is in the L level, the transmission direction control signal DIR indicates that the respective scanning lines 2 are sequentially selected from the bottom to the top and the respective data lines 3 are selected from the right to the left.

In the present embodiment, the transmission direction control signal DIR and the inverted transmission control signal DIRB are commonly supplied to the scanning line driving circuit 500 and the data line driving circuit 200, but the timing generating circuit 300 may generate a signal for the selection of the scanning lines and a signal for the selection of the data lines individually and may supply them to the scanning line driving circuit 500 and the data line driving circuit 200.

The image processing circuit 400 performs a gamma correction on input image data D in consideration of light transmission characteristics of the liquid crystal panel, performs a D/A conversion on image data of respective colors of RGB so as to generate image signals 40R, 40G, and 40B, and supplies the image signals 40R, 40G, and 40B to the liquid crystal panel AA.

2-2: Image Display Region

In the image display region A, as shown in FIG. 1, k (where k is a natural number of two or more) scanning lines 2 are formed in parallel in an X direction, and 1 (where 1 is a natural number of two or more) data lines 3 are formed in parallel in a Y direction. At each of intersections of the scanning lines 2 and the data lines 3, a TFT 50, a pixel electrode 6, and a storage capacitor 51 are provided. A gate of the TFT 50 is connected to the scanning line 2, a source thereof is connected to the data line 3, and a drain thereof is connected to the pixel electrode 6. Then, each pixel is constituted by the pixel electrode 6, a counter electrode (described below) that is formed on the counter substrate, and liquid crystal that is disposed between both electrodes. That is, the pixels are arranged in a matrix shape corresponding to the intersections of the scanning lines 2 and the data lines 3.

Further, to the respective scanning lines 2, to each of which the gate of the TFT 50 is connected, scanning signals Y1, Y2, . . . , Ym are sequentially applied in a pulsed manner. For this reason, if the scanning signal is supplied to any scanning line 2, the TFTs 50 connected to that scanning line 2 are turned on. Therefore, image signals X1, X2, . . . , Xn, which are supplied to the data lines 3 with a predetermined timing, are sequentially written into the corresponding pixels and then are held for a predetermined period.

The alignment or order of liquid crystal molecules changes according to the level of a voltage to be applied to each pixel, and thus gray-scale display by light modulation can be performed. In a normally white mode, the amount of light passing through liquid crystal is restricted as the voltage to be applied becomes high. Further, in a normally black mode, the amount of light passing through liquid crystal is relieved as the voltage to be applied becomes high. Therefore, in the entire electro-optical device 1, light having a contrast according to the image signal is emitted for each pixel. For this reason, predetermined display can be performed.

The storage capacitor 51 is added in parallel with a liquid crystal capacitor, which is formed between the pixel electrode 6 and the counter electrode, in order to prevent leakage of the held image signal. For example, the voltage of the pixel electrode 6 is held by the storage capacitor 51 for a longer time, namely, for a period as much as three orders of magnitude longer than the time for which the source voltage is applied. Therefore, the voltage holding property can be enhanced, and thus a high contrast ratio can be realized.

2-3: Data Line Driving Circuit and Sampling Circuit

The data line driving circuit 200 generates sampling signals Sm1 to Sml, which become sequentially active in synchronization with the first X clock signal XCK1, the first inverted X clock signal XCK1B, and the second X clock signal XCK2, and the second inverted X clock signal XCK2B. Further, the data line driving circuit 200 can control the sequence, in which the sampling signals Sm1 to Sml become active, by the transmission direction control signal DIR and the transmission direction control signal DIRB. Specifically, when the transmission direction control signal DIR is in the L level and the transmission direction control signal DIRB is in the H level, the sampling signals become active in the sequence of S1→S2→ . . . Sl. Further, when the transmission direction control signal DIR is in the H level and the transmission direction control signal DIRB is in the L level, the sampling signals become active in the sequence of Sl→S(l-1)→ . . . S1.

The sampling circuit 240 has n switches SW1 to SWl. The respective switches SW1 to SWl are constituted by TFTs. If the sampling signals Sm1 to Sml to be supplied to the gates of the TFTs sequentially become active, the switches SW1 to SWl sequentially become the ON state. If doing so, the image signals 40R, 40G, and 40B, which are supplied through the image signal supply lines L1 to L3, are sampled and sequentially supplied to the respective data lines 3. Therefore, if the sampling signals become active in the sequence of S1→S2→ . . . Sl, the data lines 3 are sequentially selected from the right to the left. Moreover, the sampling circuit 240 may be included in the data line driving circuit 200.

Figure 2:
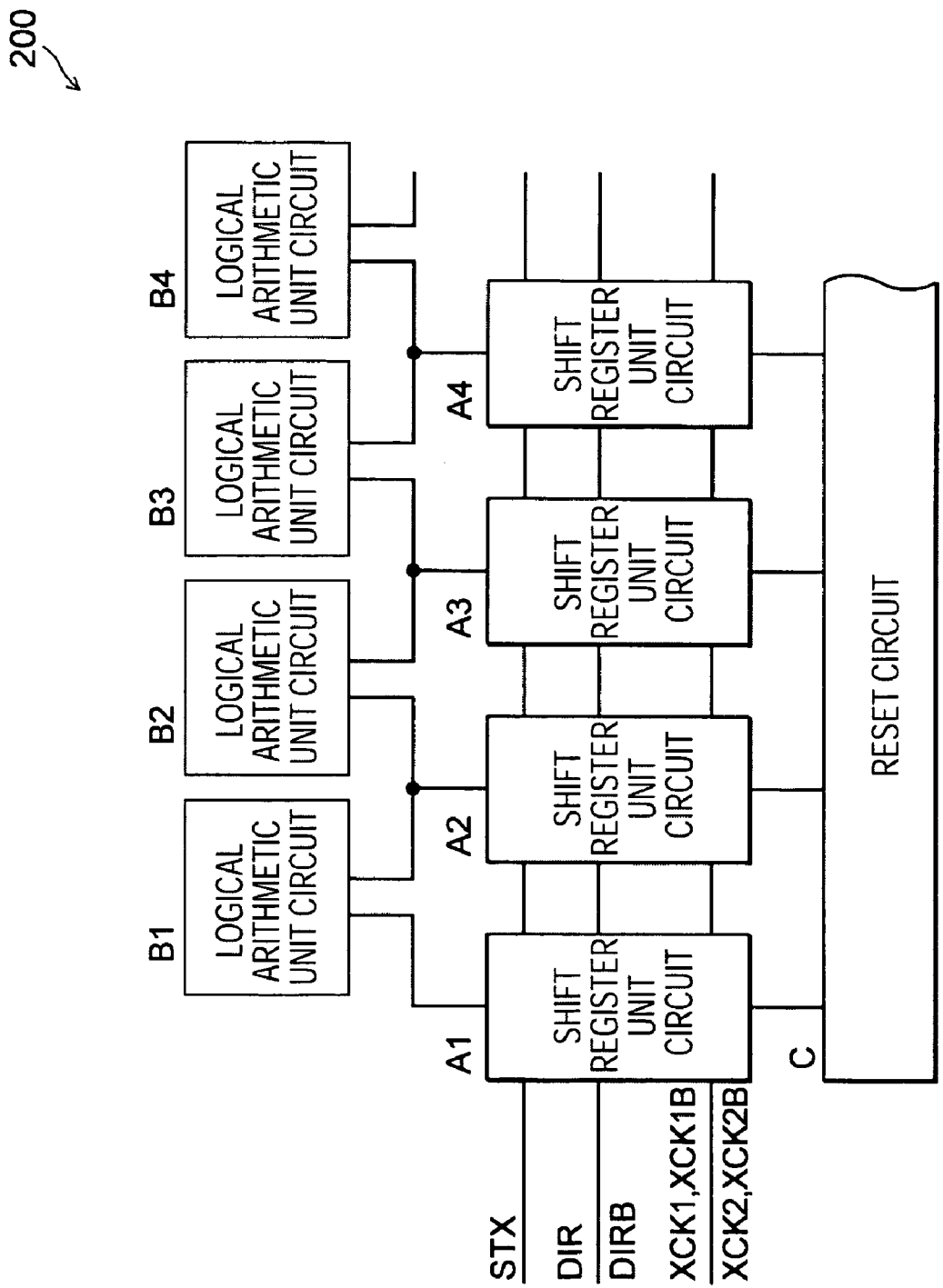
FIG. 2 is a block diagram showing the configuration of the data line driving circuit.

FIG. 2 is a block diagram showing the configuration of the data line driving circuit 200. The data line driving circuit 200 has n shift register unit circuits A1, A2, . . . , An (where n is a natural number of two or more), n-1 logical arithmetic unit circuits B1, B2, . . . , B(n-1), and a reset circuit C.

Among these, the logical arithmetic unit circuit B substantially has the same configuration as that of the bidirectional shift register 100 described above. That is, the logical arithmetic unit circuit B is an AND circuit when the data line driving circuit 200 is constituted in a positive logic and is a NOR circuit when the data line driving circuit 200 is constituted in a negative logic.

Further, the reset circuit C supplies a reset signal R to the shift register unit circuits A1 to An.

Figure 3:
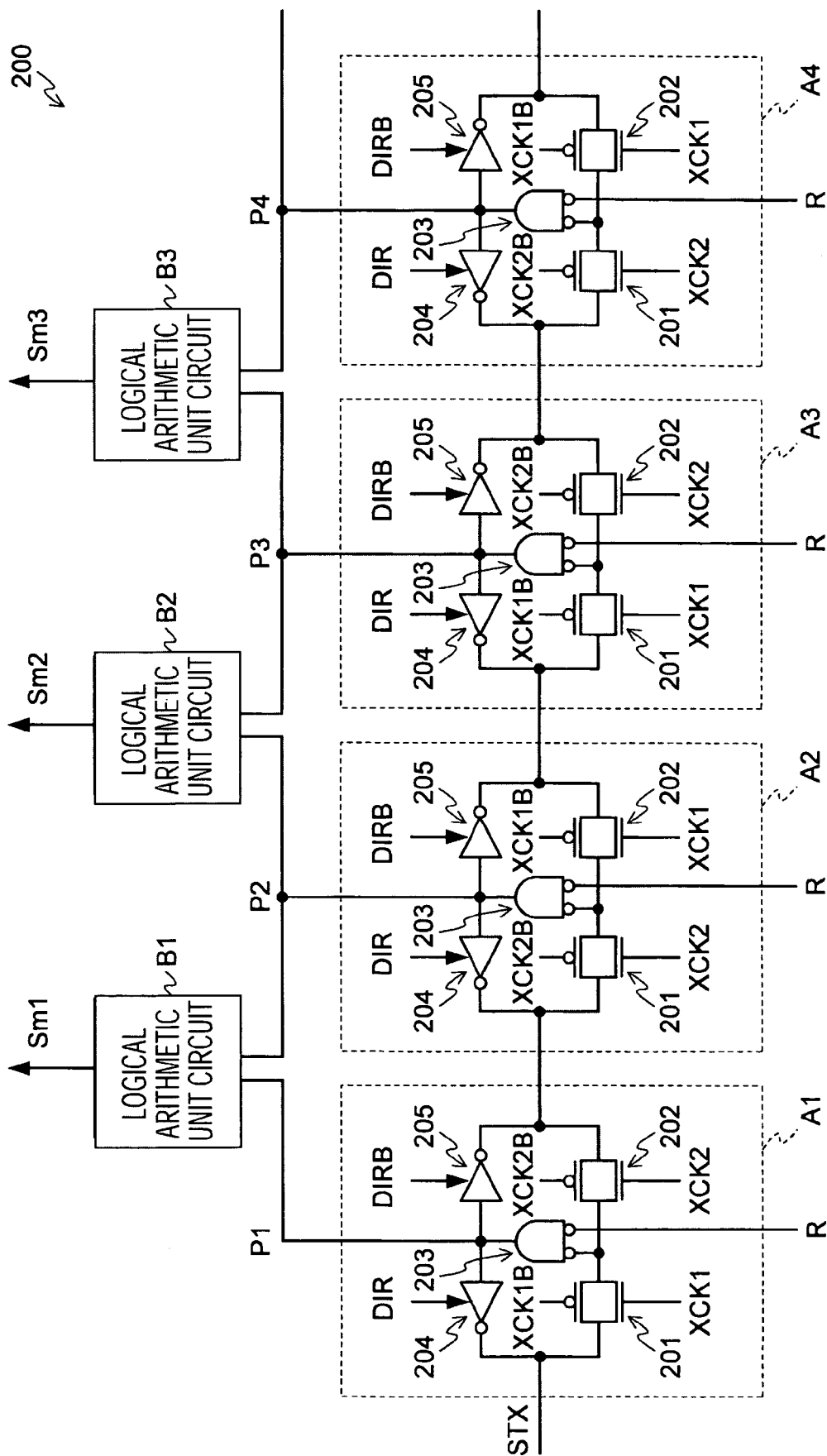
FIG. 3 is a circuit diagram of a part of the data line driving circuit.

FIG. 3 is a circuit diagram of a part of the data line driving circuit 200. The data line driving circuit 200 is constituted in the positive logic. Hereinafter, the shift register unit circuits A1 to A4 will be described in detail, but other shift register unit circuits A5 to An also have the same configuration as those of the shift register unit circuits A1 to A4.

Each of the shift register unit circuits A1 to A4 has first and second transfer gates 201 and 202, a first logical circuit 203, and first and second clocked inverters 204 and 205. An output terminal of the first logical circuit 203 is connected to input terminals of the first clocked inverters 204 and 205, and output terminals of the first and second clocked inverters 204 and 205 are connected to an input terminal of the first logical circuit 203 through the first and second transfer gates 201 and 202.

The first logical circuit 203 is a NOR circuit that inverts a signal output from the first or second transfer gate 201 or 202 and the reset signal R output from the reset circuit C and calculates a logical product of both signals. Therefore, the first logical circuit 203 inverts an input signal from the first or second transfer gate 201 or 202 and outputs the inverted signal as long as the reset signal R is in the L level. On the other hand, if the reset signal R becomes the H level, the first logical circuit 203 outputs a signal of the L level, regardless of the level of the input signal from the first or second transfer gate 201 or 202.

Moreover, when the data line driving circuit is constituted in the negative logic, the first logical circuit 203 serves as a NAND circuit. In this case, the first logical circuit 203 inverts the input signal from the first or second transfer gate 201 or 202 and outputs the inverted signal as long as the reset signal R is in the H level. On the other hand, if the reset signal R becomes the L level, the first logical circuit 203 outputs a signal of the H level, regardless of the level of the input signal from the first or second transfer gate 201 or 202.

One of the first X clock signal XCK1 and the second X clock signal XCK2 is supplied to a control terminal of the first transfer gate 201, and the other of the first X clock signal XCK1 and the second X clock signal XCK2 is supplied to the second transfer gate 202. The shift register unit circuits A1 to A4 transmit the X transmission start pulse STX in synchronization with the first X clock signal XCK1 and the second X clock signal XCK2.

Further, the transmission direction control signal DIR is supplied to a control terminal of the first clocked inverter 204, and the inverted transmission direction control signal DIRB is supplied to a control terminal of the second clocked inverter 205. Accordingly, only one of the first and second clocked inverters 204 and 205 is turned on, and thus the transmission direction of the X transmission start pulse STX is set.

Here, it is assumed that the logical level of the inverted transmission direction control signal DIRB is in the H level. That is, all the first clocked inverters 204 are in a high impedance state, and all the second clocked inverters 205 are in an ON state, such that the X transmission start pulse STX is transmitted from the left to the right in FIG. 3.

Next, the operations of the shift register unit circuits A1 to A4 will be described.

It is assumed that the X transmission start pulse STX, which is in the active state at the time of the H level, is input, the first X clock signal XCK1 is in the H level, and the second X clock signal XCK2 is in the L level.

In this state, in the shift register unit circuit A1, the first transfer gate 201 is in the ON state, and the output of an output signal P1 becomes the H level.

On the other hand, in the shift register unit circuit A1, the second transfer gate 202 is in the high impedance state. Further, in the shift register unit circuit A2, the input of the first transfer gate 201 is also in the high impedance state of the L level.

From this state, if the first X clock signal XCK1 becomes the L level and the second X clock signal XCK2 becomes the H level, in the shift register unit circuit A1, the first transfer gate 201 changes from the ON state to the high impedance state. Simultaneously, the second transfer gate 202 changes from the high impedance state to the ON state. Therefore, in the shift register unit circuit A1, a latch circuit is constituted by the second transfer gate 202 and the first logical circuit 203, and thus the output of the output signal P1 still maintains the H level.

On the other hand, in the shift register unit circuit A2, the input of the first clocked inverter 204 changes from the high impedance state of the L level to the ON state, and the output of an output signal P2 becomes the H level.

Subsequently, from this state, if the second X clock signal XCK2 becomes the L level and the first X clock signal XCK1 becomes the H level, in the shift register unit circuit A1, the first transfer gate 201 changes from the high impedance state to the ON state. Simultaneously, the second transfer gate 202 changes from the ON state to the high impedance state. Therefore, the output of the output signal P1 becomes the L level.

On the other hand, in the shift register unit circuit A2, a latch circuit is constituted, and thus the output of the output signal P2 still maintains the H level. Further, in the shift register unit circuit A3, the output of an output signal P3 changes from the L level to the H level.

As such, in the shift register unit circuits A1 to An, the timing at which each of the output signals P1 to Pn changes from the L level to the H level is determined by the timing at which the first transfer gate 201 changes from the high impedance state to the ON state.

Further, the timing at which each of the output signals P1 to Pn changes from the H level to the L level is determined by the timing at which the first transfer gate 201 changes from the high impedance state to the ON state.

Next, the operations of the shift register unit circuits A1 to A4 when the data line driving circuit is constituted in the negative logic will be described.

It is assumed that the X transmission start pulse STX, which is in the active state at the time of the L level, is input, the first X clock signal XCK1 is in the H level, and the second X clock signal XCK2 is in the L level.

In this state, in the shift register unit circuit A1, the first transfer gate 201 is in the ON state, and the output of the output signal P1 becomes the L level.

On the other hand, in the shift register unit circuit A1, the second transfer gate 202 is in the high impedance state. Further, in the shift register unit circuit A2, the input of the first transfer gate 201 is also in the high impedance state of the H level.

From this state, if the first X clock signal XCK1 becomes the L level and the second X clock signal XCK2 becomes the H level, in the shift register unit circuit A1, the first transfer gate 201 changes from the ON state to the high impedance state. Simultaneously, the second transfer gate 202 changes from the high impedance state to the ON state. Therefore, in the shift register unit circuit A1, a latch circuit is constituted by the second transfer gate 202 and the first logical circuit 203, and thus the output of the output signal P1 still maintains the L level.

On the other hand, in the shift register unit circuit A2, the input of the first clocked inverter 204 changes from the high impedance state of the L level to the ON state, and the output of the output signal P2 becomes the H level.

Subsequently, from this state, if the second X clock signal XCK2 becomes the L level and the first X clock signal XCK1 becomes the H level, in the shift register unit circuit A1, the first transfer gate 201 changes from the high impedance state to the ON state. Simultaneously, the second transfer gate 202 changes from the ON state to the high impedance state. Therefore, the output of the output signal P1 becomes the H level.

On the other hand, in the shift register unit circuit A2, a latch circuit is constituted, and thus the output of the output signal P2 still maintains the L level. Further, in the shift register unit circuit A3, the output of the output signal P3 changes from the H level to the L level.

As such, in the shift register unit circuits A1 to An, the timing at which each of the output signals P1 to Pn changes from the H level to the L level is determined by the timing at which the first transfer gate 201 changes from the high impedance state to the ON state.

Further, the timing at which each of the output signals P1 to Pn changes from the L level to the H level is determined by the timing at which the first transfer gate 201 changes from the high impedance state to the ON state.

2-3-1: Configuration of Transfer Gate Operating by First Clock Signal

The transfer gate which constituting each of the above-described shift register unit circuits A1 to An and which operates when the first X clock signal XCK1 is in the H level has the following configuration.

Figure 4:
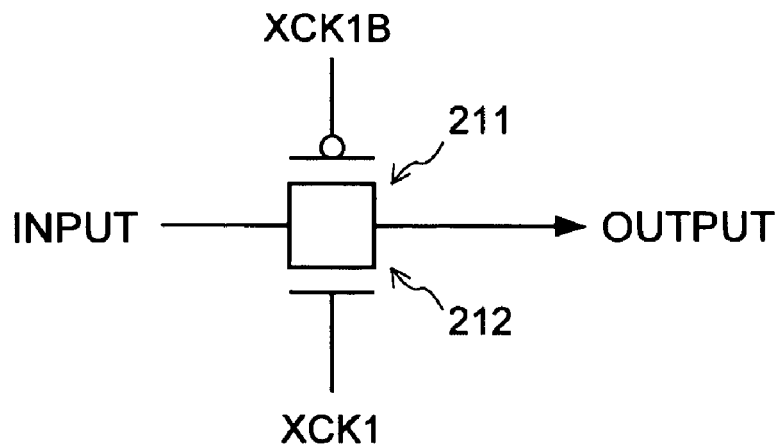
FIG. 4 is a circuit diagram of a transfer gate, which operates by a clock signal, at a transistor level.

FIG. 4 is a circuit diagram of the transfer gate, which operates by the first clock signal XCK1, at a transistor level.

The transfer gate has a pMOS 211 and an nMOS 212. Specifically, sources of the pMOS 211 and the nMOS 212 are connected to an input terminal, and drains of the pMOS 211 and the nMOS 212 are connected to an output terminal. Further, the transfer gate operates if the first X clock signal XCK1 becomes the H level, and thus the first inverted X clock signal XCK1B is supplied to the pMOS 211, and the first X clock signal XCK1 is supplied to the nMOS 212.

The transfer gate becomes the ON state only if the pMOS 211 or the nMOS 212 becomes the ON state, regardless of the level of the input. Further, the transfer gate becomes the high impedance state when both the pMOS 211 and the nMOS become the high impedance state first, regardless of the level of the input.

Therefore, the operation of the transfer gate, which operates when the first X clock signal XCK1 becomes the H level, is divided into two modes described below.

(3-1) When the pMOS 211 becomes the ON state by the first inverted X clock signal XCK1B or when the nMOS 212 becomes the ON state by the first X clock signal XCK1, the transfer gate changes from the high impedance state to the ON state.

(3-2) When the pMOS 211 becomes the high impedance state by the first inverted X clock signal XCK1B, and the nMOS 212 becomes the high impedance state by the first X clock signal XCK1, the transfer gate changes from the ON state to the high impedance state.

2-3-2: Configuration of Transfer Gate Operating by Second Clock Signal

Figure 5:
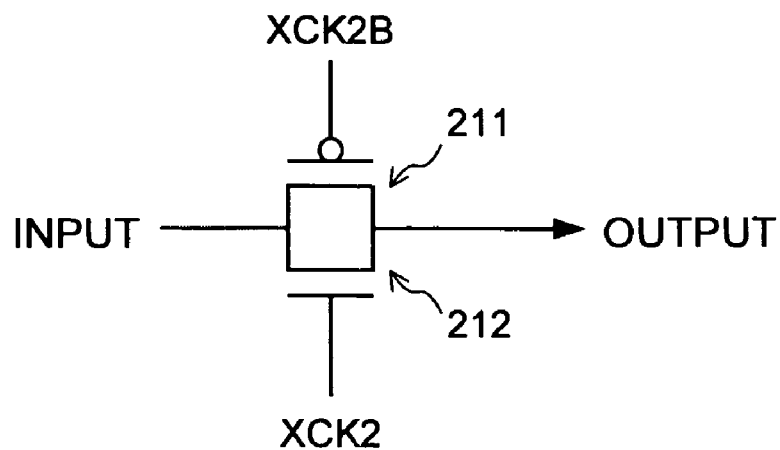
FIG. 5 is a circuit diagram of a transfer gate, which operates by an inverted clock signal, at a transistor level.

FIG. 5 is a circuit diagram of the transfer gate, which operates by the second clock signal XCK2, at a transistor level.

The transfer gate substantially has the same configuration as that of the transfer gate, which operates when the first X clock signal XCK1 is in the H level. However, the transfer gate operates when the second X clock signal XCK2 becomes the H level, and thus the second inverted X clock signal XCK2B is supplied to the pMOS 211, and the second X clock signal XCK2 is supplied to the nMOS 212.

The operation of the transfer gate, which operates when the second X clock signal XCK2 becomes the H level, is divided into two modes described below.

(4-1) When the pMOS 211 becomes the ON state by the second inverted X clock signal XCK2B or when the nMOS 212 becomes the ON state by the second X clock signal XCK2, the transfer gate changes from the high impedance state to the ON state.

(4-2) When the pMOS 211 becomes the high impedance state by the second inverted X clock signal XCK2B, and the nMOS 212 becomes the high impedance state by the second X clock signal XCK2, the transfer gate changes from the ON state to the high impedance state.

2-3-3: Influence of Clock Signal and Inverted Clock Signal on Output Signal

The first X clock signal XCK1, the first inverted X clock signal XCK1B, the second X clock signal XCK2, and the second inverted X clock signal XCK2B generated by the above-described inverted clock signal generating circuit 120 are supplied to the data line driving circuit 200.

Like the clock signals CK1 and CK2 and the inverted clock signals CK1B and CK2B described above, as for the first X clock signal XCK1, the first inverted X clock signal XCK1B, the second X clock signal XCK2, and the second inverted X clock signal XCK2B, the delay time Td is present between a rising edge of the clock signal XCK1 or XCK2 and a rising edge of the inverted clock signal XCK1B or XCK2B. Further, the delay time Td is present between a falling edge of the clock signal XCK1 or XCK2 and a falling edge of the inverted clock signal XCK1B or XCK2B. Here, the H-level periods of the clock signals XCK1 and XCK2 are set so as not to overlap each other.

Figure 6:
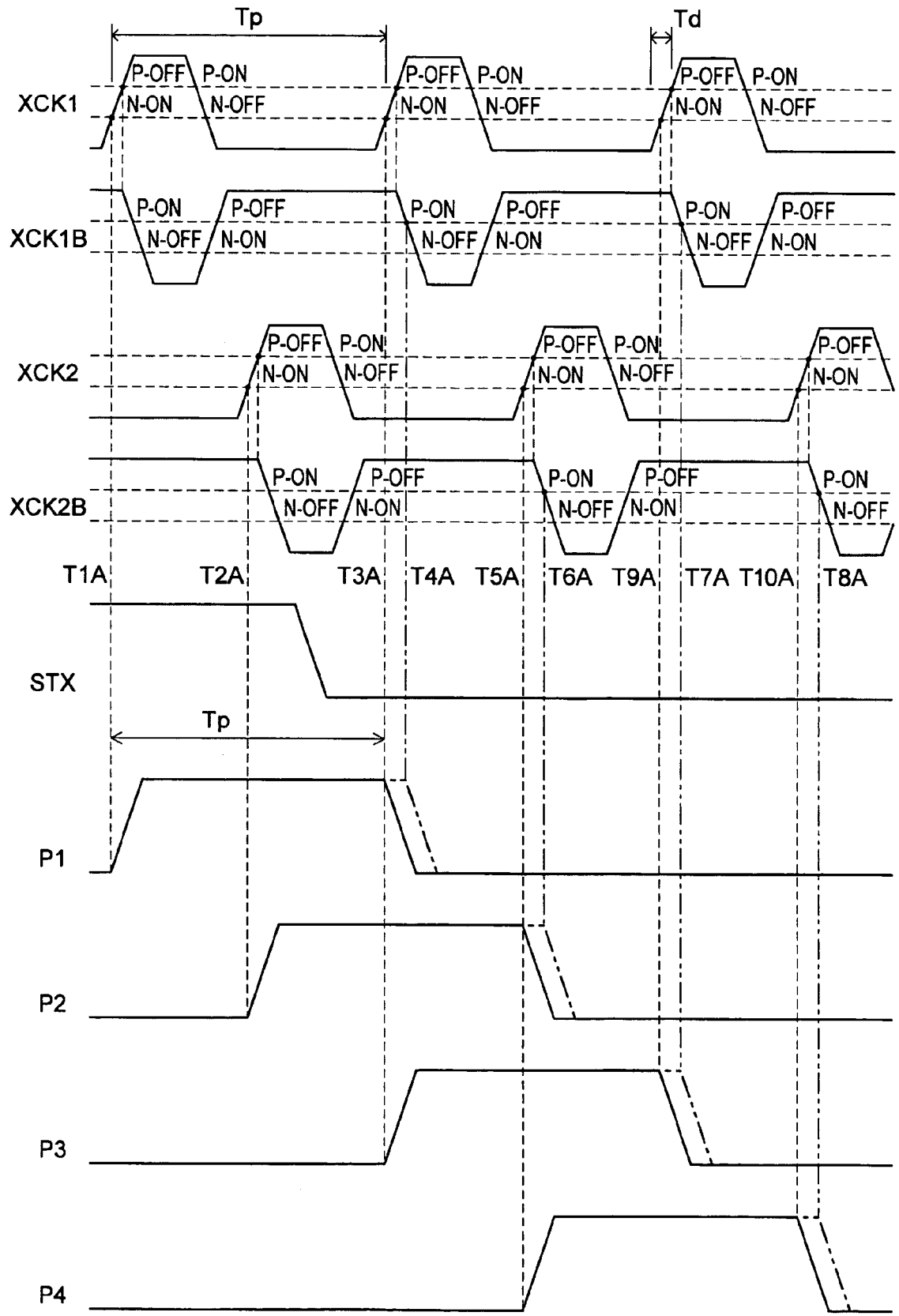
FIG. 6 is a timing chart when the data line driving circuit is constituted in a positive logic.

FIG. 6 is a timing chart when the data line driving circuit is constituted in the positive logic. Moreover, in FIG. 6, the timing chart of the related art bidirectional shift register is shown in a two-dot-chain line. That is, in an odd-numbered shift register unit circuit A of the shift register unit circuits A1 to An, when the first X clock signal XCK1 becomes the H level, the first transfer gate 201 changes from the high impedance state to the ON state. Accordingly, at the time T1A or T3A, an odd-numbered output signal P changes from the L level to the H level when the nMOS 212 becomes the ON state by the first X clock signal XCK1 (3-1).

On the other hand, in the odd-numbered shift register unit circuit A, when the first X clock signal XCK1 becomes the H level, the first transfer gate 201 changes from the high impedance state to the ON state. Accordingly, at the time T3A or T9A, the odd-numbered output signal P changes from the H level to the L level when the nMOS 212 becomes the ON state by the first X clock signal XCK1 (3-1).

Further, in an even-numbered shift register unit circuit A of the shift register unit circuits A1 to An, when the second X clock signal XCK2 becomes the H level, the input of the first transfer gate 201 changes from the high impedance state to the ON state. Accordingly, at the time T2A or T5A, an even-numbered output signal P changes from the L level to the H level when the nMOS 212 becomes the ON state by the second X clock signal XCK2 (4-1).

On the other hand, in the even-numbered shift register unit circuit A, when the second X clock signal XCK2 becomes the H level, the input of the first transfer gate 201 changes from the high impedance state to the ON state. Accordingly, at the time T5A or T10A, the even-numbered output signal P changes from the H level to the L level when the nMOS 212 becomes the ON state by the second X clock signal XCK2 (4-1).

Therefore, when the data line driving circuit is constituted in the positive logic, the pulse width of the output signal P becomes Tp.

Figure 7:
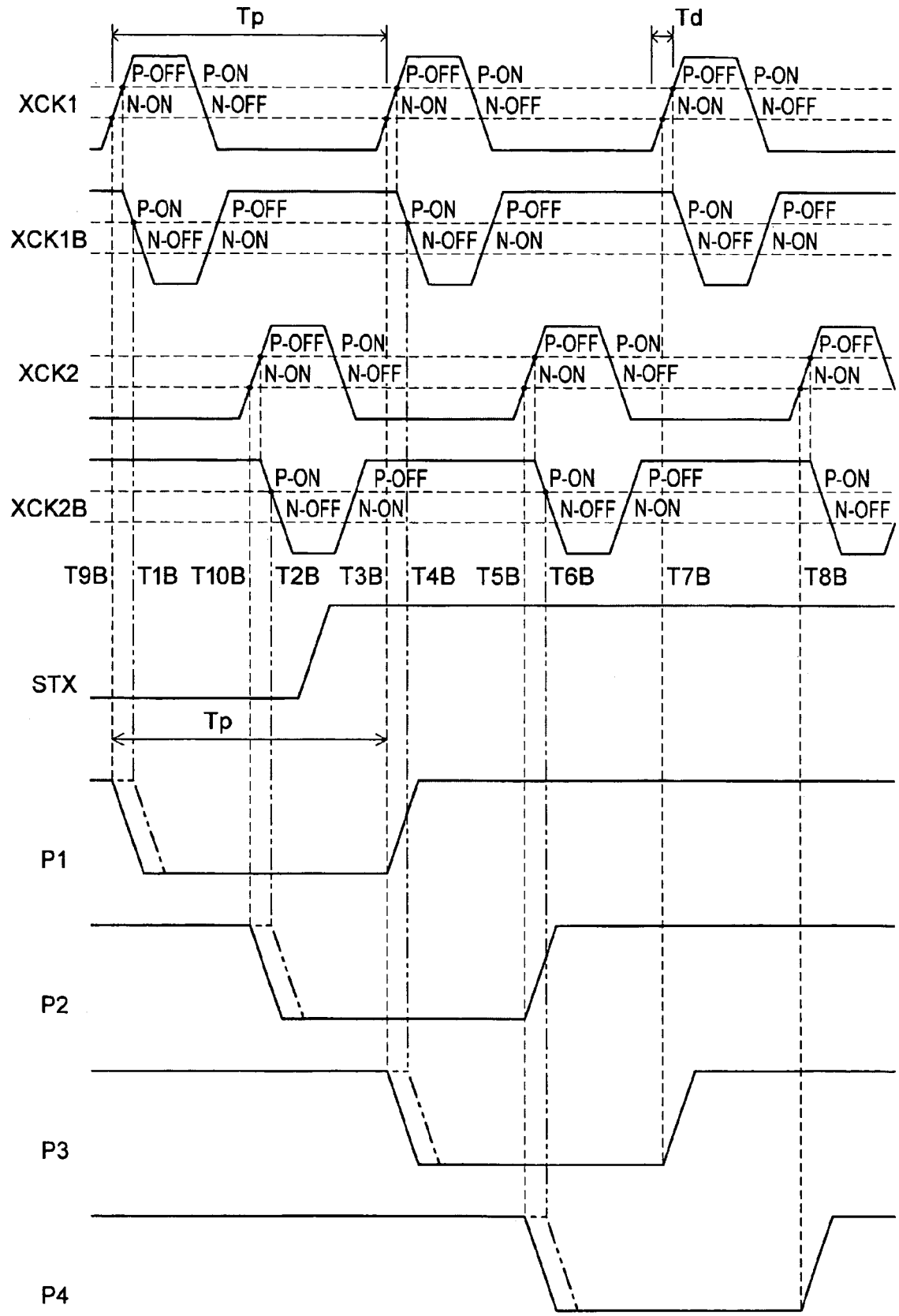
FIG. 7 is a timing chart when the data line driving circuit is constituted in a negative logic.

FIG. 7 is a timing chart when the data line driving circuit is constituted in the negative logic.

In the odd-numbered shift register unit circuit A of the shift register unit circuits A1 to An, when the first X clock signal XCK1 becomes the H level, the first transfer gate 201 changes from the high impedance state to the ON state. Accordingly, at the time T9B or T3B, the odd-numbered output signal P changes from the H level to the L level when the nMOS 212 becomes the ON state by the first X clock signal XCK1 (3-1).

On the other hand, in the odd-numbered shift register unit circuit A, when the first X clock signal XCK1 becomes the H level, the first transfer gate 201 changes from the high impedance state to the ON state. Accordingly, at the time T3B or T7B, the odd-numbered output signal P changes from the L level to the H level when the nMOS 212 becomes the ON state by the first X clock signal XCK1 (3-1).

Further, in the even-numbered shift register unit circuit A of the shift register unit circuits A1 to An, when the second X clock signal XCK2 becomes the H level, the first transfer gate 201 changes from the high impedance state to the ON state. Accordingly, at the time T10B or T5B, the even-numbered output signal P changes from the H level to the L level when the nMOS 212 becomes the ON state by the second X clock signal XCK2 (4-1).

On the other hand, in the even-numbered shift register unit circuit A, when the second X clock signal XCK2 becomes the H level, the first transfer gate 201 changes from the high impedance state to the ON state. Accordingly, at the time T5B or T8B, the even-numbered output signal P changes from the L level to the H level when the nMOS 212 becomes the ON state by the second X clock signal XCK2 (4-1).

Therefore, when the data line driving circuit is constituted in the positive logic, the pulse width of the output signal becomes Tp.

2-4: Scanning Line Driving Circuit

Figure 8:
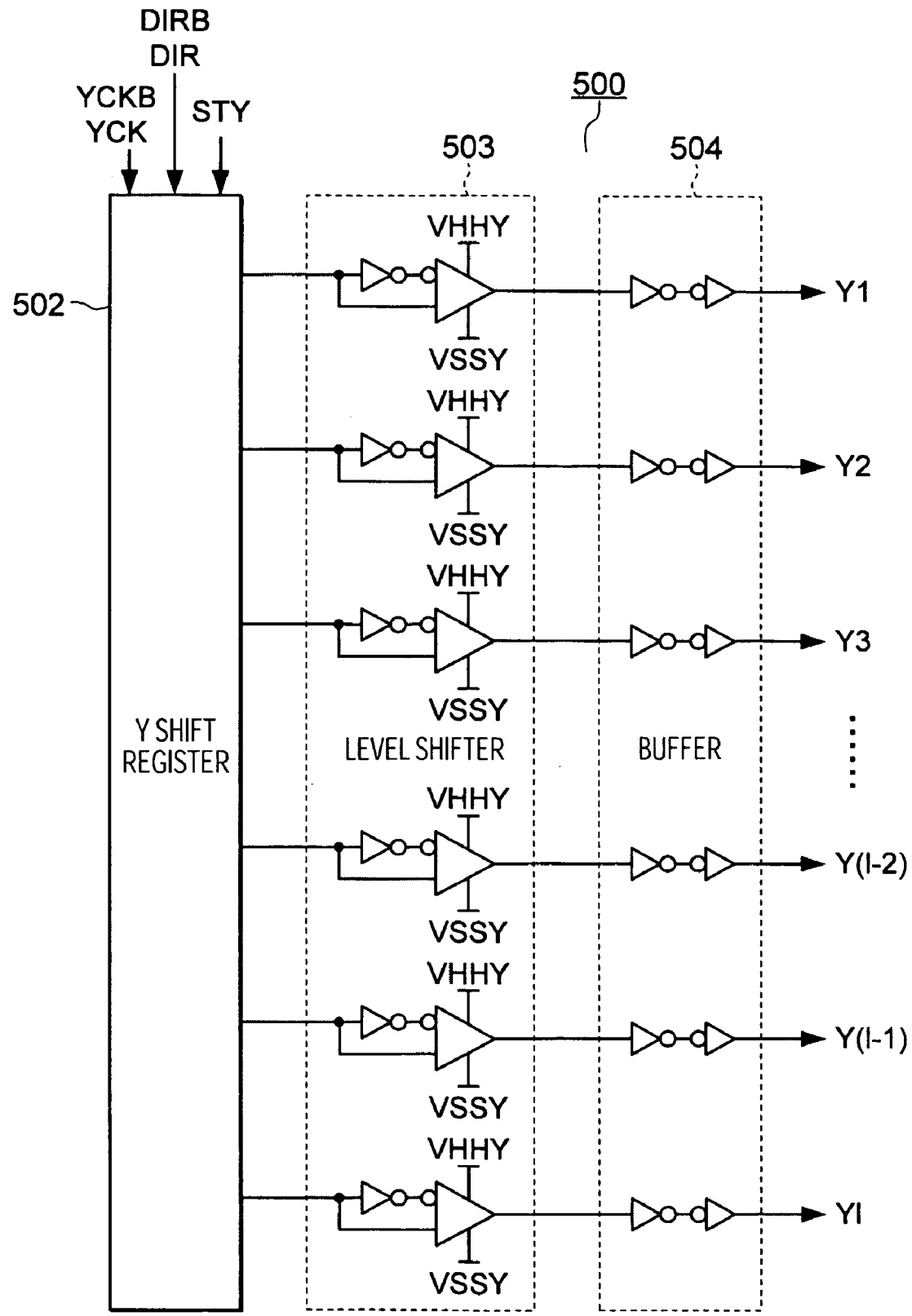
FIG. 8 is a block diagram showing the configuration of a scanning line driving circuit of the electro-optical device.

Next, the scanning line driving circuit 500 will be described. FIG. 8 is a block diagram showing the configuration of the scanning line driving circuit 500. The scanning line driving circuit 500 has a Y shift register 502, a level shifter 503, and a buffer 504.

The Y shift register 502 has the same configuration as that of the above-described data line driving circuit 200, except that the first Y clock signal YCK1, the first inverted Y clock signal YCK1B, the second Y clock signal YCK2, and the second inverted Y clock signal YCK2B are supplied thereto, instead of the first X clock signal XCK1, the first inverted X clock signal XCK1B, the second X clock signal XCK2, and the second inverted X clock signal XCK2B, and the number of stages of the shift register unit circuits are different.

The level shifter 503 shifts the levels of output signals of the Y shift register 502 so as to convert them into the levels suitable for driving the scanning lines 2. Further, the buffer 504 converts the output signals of the level shifter 503 into low impedance states, and outputs the converted signals to the respective scanning lines 2 as the scanning signals Y1, Y2, . . . , Ym. Moreover, in the scanning line driving circuit 500, the Y shift register 502 constituted in the negative logic may be applied.

According to the present embodiment, the following effects are obtained.

When the data line driving circuit is constituted in the positive logic or the negative logic, the pulse widths of the output signals P are made uniform as Tp. For this reason, for example, at the time of the design change of the data line driving circuit 200, the change in pulse width of the output signal P does not need to be considered, and thus design working can be rapidly performed.

Further, of five circuit elements constituting each of the shift register unit circuits A1 to An, the two transfer gates 201 and 202, the first logical circuit 203, and the clocked inverter 204 or 205 operate. Accordingly, the number of circuit elements in which power consumes is two. Therefore, power consumption can be reduced, as compared with the related art shift register.

The reset circuit C is provided, and the reset signal R is input from the reset circuit C to the first logical circuit 203. Accordingly, the first logical circuit 203 outputs the signal of the L level at the time of the positive logic and output the signal of the H level at the time of the negative logic, regardless of the level of the input signal from the first or second transfer gate 201 or 202. Therefore, the initial states of all the shift register unit circuits can be easily equalized.

Further, the transmission direction of the X transmission start pulse STX is controlled by use of the transmission direction control signal DIR and the inverted transmission direction control signal DIRB. Therefore, the left and right or the top and bottom of the display image of liquid crystal can be reversed, without changing the supply sequence of the images signals 40R, 40G, and 40B.

2-5: Example of Configuration of Liquid Crystal Panel

Figure 9:
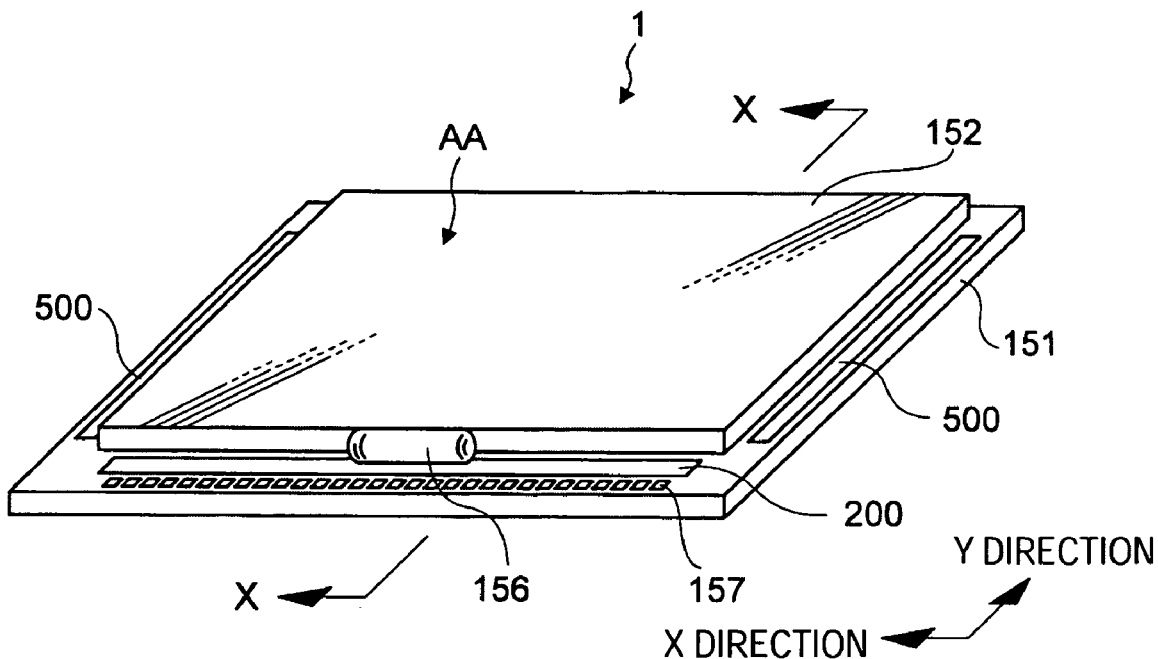
FIG. 9 is a perspective view illustrating the structure of the electro-optical device.
Figure 10:
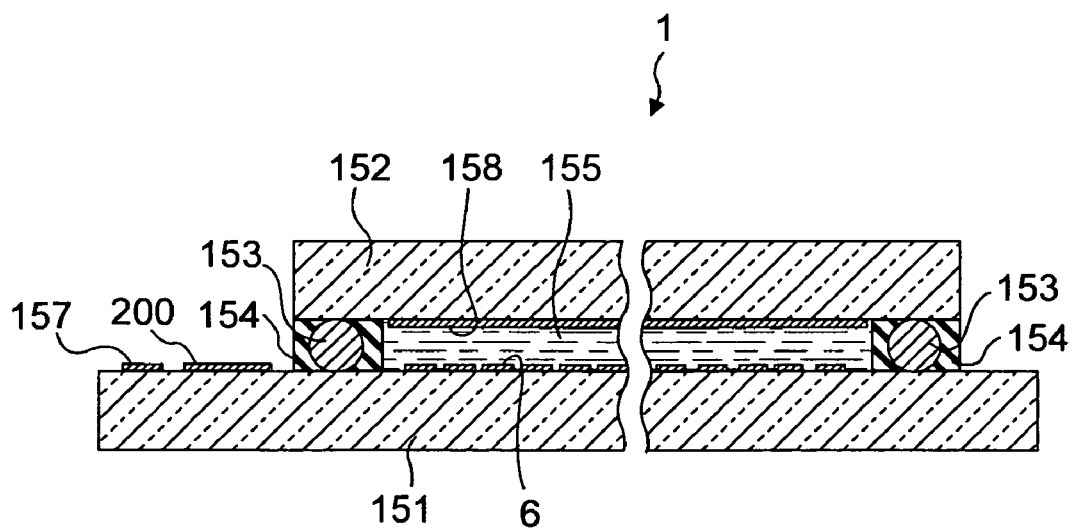
FIG. 10 is a cross-sectional view illustrating the structure of the electro-optical device which is taken along the line X-X of FIG. 9.

Next, the overall configuration of the electro-optical device 1 according to the above-described electrical configuration will be described with reference to FIGS. 9 and 10. Here, FIG. 9 is a perspective view showing the configuration of the electro-optical device 1, and FIG. 10 is a cross-sectional view taken along the line X-X of FIG. 9. A liquid crystal panel AA has an element substrate 151 made of glass or a semiconductor, on which the pixel electrodes 6 and the like are formed, and a transparent counter substrate 152 made of glass or the like, on which a common electrode 158 and the like is formed, with liquid crystal 155 filled in the gap between the element substrate 151 and the counter substrate 152.

In an outer circumference of the counter substrate 152, a sealing member 154 for sealing the gap between the element substrate 151 and the counter substrate 152 is provided. The sealing member 154 defines a space, in which liquid crystal 155 is filled, together with the element substrate 151 and the counter substrate 152. In the sealing member 154, spaces 153 for maintaining the gape between the element substrate 151 and the counter substrate 152 are mixed. Moreover, in the sealing member 154, an opening for filling liquid crystal 155 is formed, and the opening is sealed by a sealing material 156 after liquid crystal 155 is filled.

Here, on one side outside the sealing member 154 on the surface of the element substrate 151 facing the counter substrate 152, the above-described data line driving circuit 200 is formed so as to drive the data lines 3 extending in the Y direction. In addition, on the side, a plurality of connecting electrodes 157 are formed, to which various signals from the timing generating circuit 300 or the image signals 40R, 40G, and 40B are input. On sides neighboring to the side, the scanning line driving circuits 500 are formed so as to drive the scanning lines 2 extending in the X direction from both sides. On the other hand, the common electrode 158 of the counter substrate 152 is electrically connected to the element substrate 151 by a connecting material, which is provided on at least one of four corners of the bonded portion between the element substrate 151 and the counter substrate 152. In addition, on the counter substrate 152, according to uses of the liquid crystal panel AA, color filters to be arranged in stripe shapes, a mosaic shape, or a triangle shape are provided, a black matrix made of a metal material, such as chromium or nickel, or resin black in which carbon or titanium is dispersed into photoresist, is provided, and a backlight for irradiating light onto the liquid crystal panel AA is provided. In particular, in case of uses of color light modulation, the black matrix is provided on the counter substrate 152, while the color filters are not provided.

Further, on the surfaces of the element substrate 151 and the counter substrate 152 facing each other, alignment films, each being subjected to a rubbing treatment in a predetermined direction, are provided. In addition, on the respective rear sides of the element substrate 151 and the counter substrate 152, polarizing plates (not shown) are provided according to the corresponding alignment directions. However, if polymer-dispersed liquid crystal, in which liquid crystal 155 is dispersed in a polymer as infinitesimal particles, is used as liquid crystal, the alignment films and the polarizing plates, and the like described above do not need to be provided, and thus efficiency of light utilization is advantageously increased, which results in high luminance and low power consumption. Moreover, a driving IC chip that is mounted on a film by using, for example, a tape automated bonding (TAB) technology may be electrically and mechanically connected to the element substrate 151 through an anisotropic conductive film, which is provided at a predetermined position on the element substrate 151, instead of all or part of peripheral circuits, such as the data line driving circuit 200 and the scanning line driving circuits 500 being formed on the element substrate 151. Further, the driving IC chip itself may be electrically and mechanically connected to a predetermined position on the element substrate 151 through the anisotropic conductive film by using a chip on glass (COG) technology.

3: Application

In the above-described embodiment, the electro-optical device having liquid crystal has been exemplified, but the invention can be applied to an electro-optical device which uses an electro-optical material other than liquid crystal. The electro-optical material is a material of which optical characteristics, such as transmittance or luminance, change by the supply of an electrical signal (current signal or voltage signal). For example, like the embodiments, the invention can be applied to various electro-optical devices, such as a display panel in which an OLED (Organic Light Emitting Diode) element, such as an organic electroluminescent element or a light-emitting polymer, is used as the electro-optical material, an electrophoretic display device panel in which a microcapsule containing colored liquid and white particles dispersed in the colored liquid is used as the electro-optical material, a twist ball display panel that uses twist balls, in which different colored balls are coated to regions having different polarities, as an electro-optical material, a toner display panel in which a black toner is used as the electro-optical material, a plasma display panel in which high-pressure gas, such as helium or neon, is used as the electro-optical material, and the like.

4: Electronic Apparatus

Figure 11:
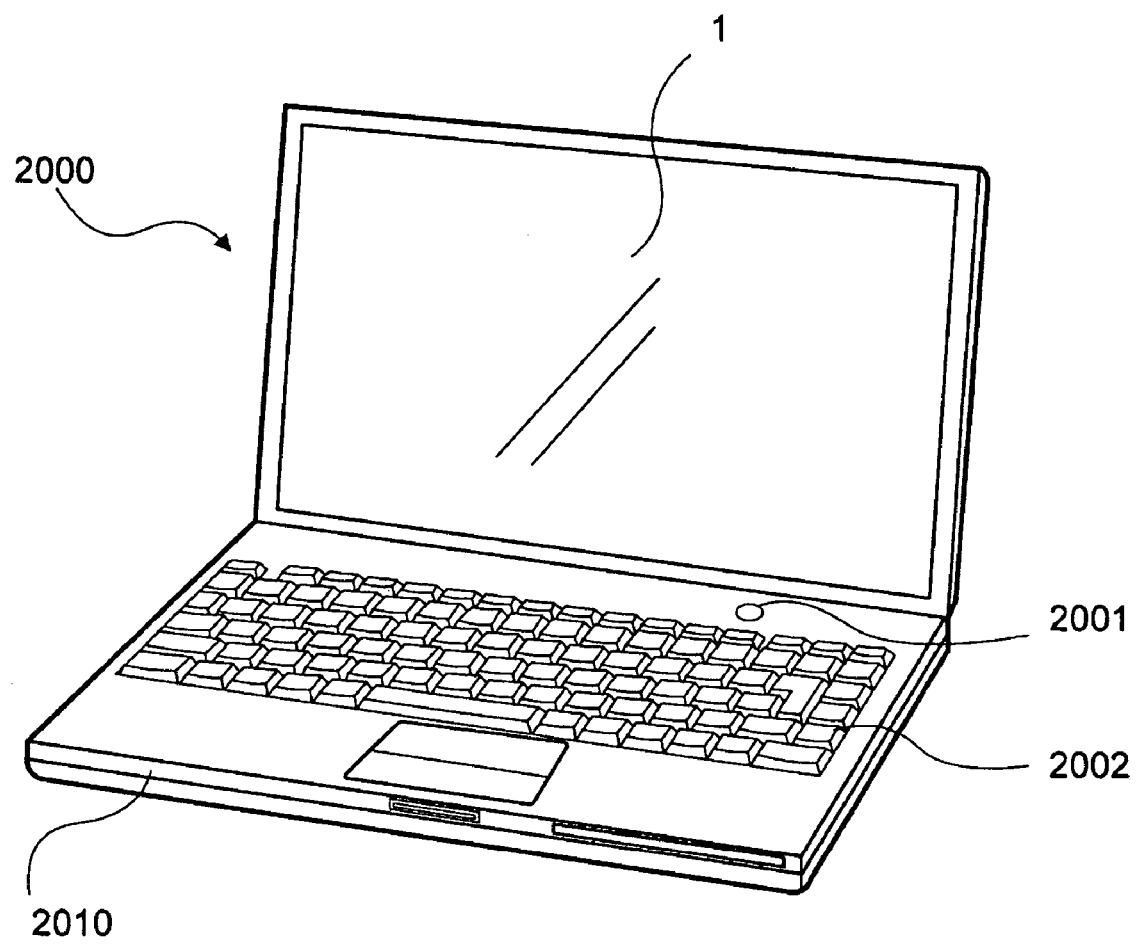
FIG. 11 is a perspective view showing the configuration of a mobile-type personal computer, to which the electro-optical device is applied.

Next, an electronic apparatus, to which the electro-optical device 1 according to the embodiment or the application described above is applied, will be described. FIG. 11 shows the configuration of a mobile-type personal computer, to which the electro-optical device 1 is applied. A personal computer 2000 has the electro-optical device 1 as a display unit, and a main body 2010. In the main body 2010, a power supply switch 2001 and a keyboard 2002 are provided. The electro-optical device 1 has the simplified data line driving circuit 200, thereby displaying high-definition images at narrow pitches.

Figure 12:
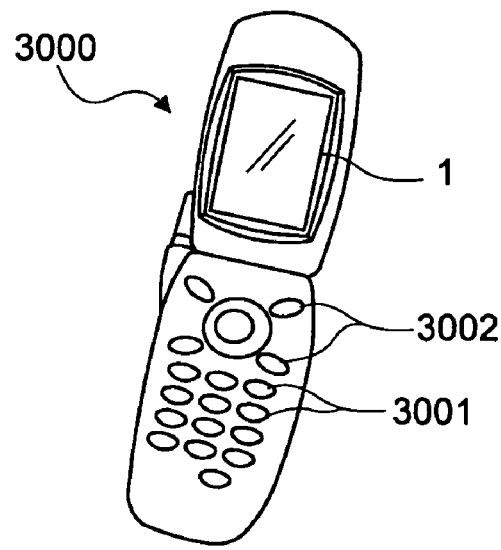
FIG. 12 is a perspective view showing the configuration of a cellular phone, to which the electro-optical device is applied.
Figure 13:
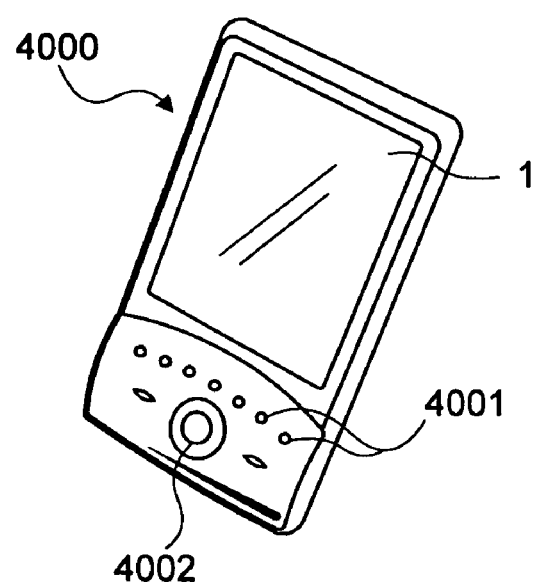
FIG. 13 is a perspective view showing the configuration of a personal digital assistant, to which the electro-optical device is applied.
Figure 14:
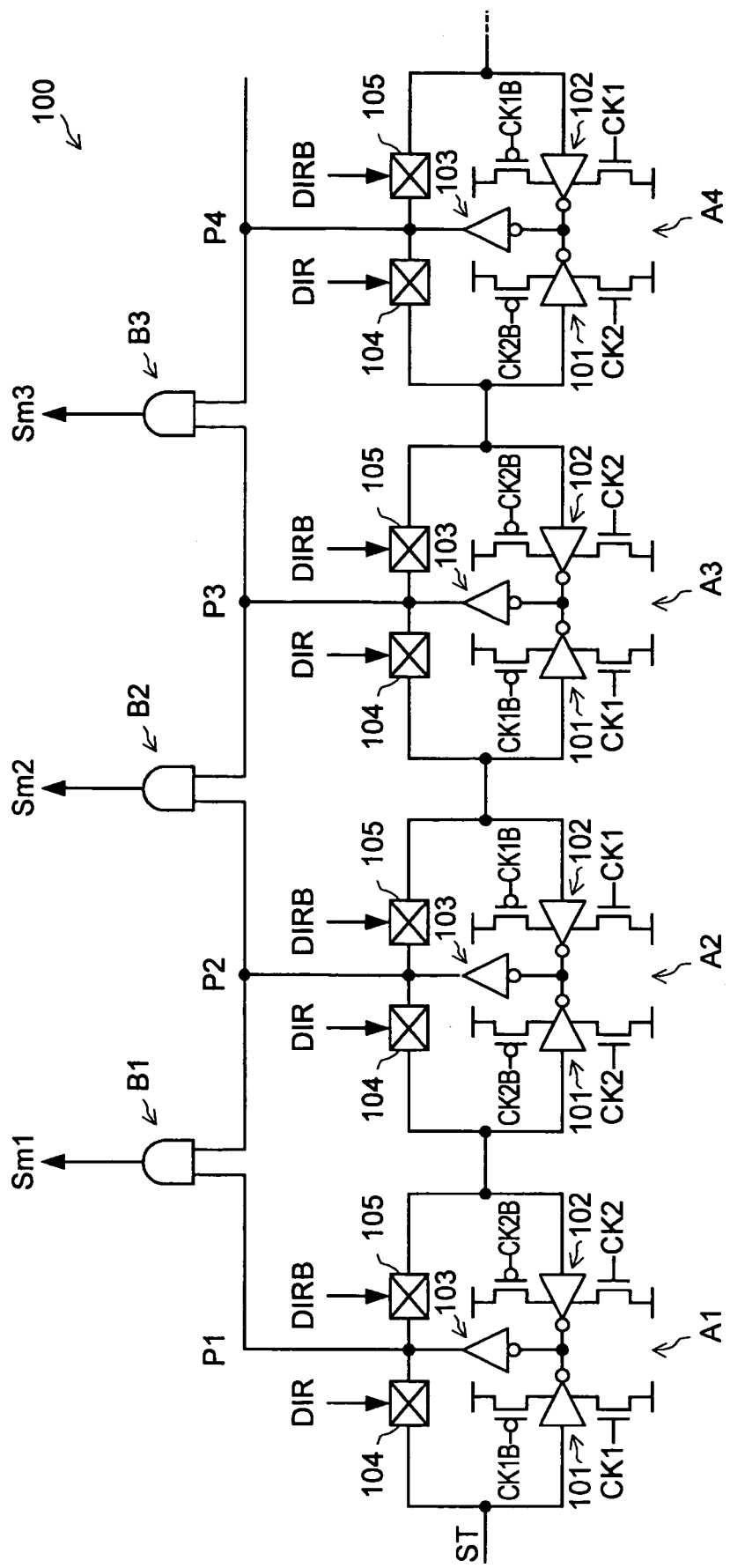
FIG. 14 is a circuit diagram of a part of a bidirectional shift register according to the related art.
Figure 15:
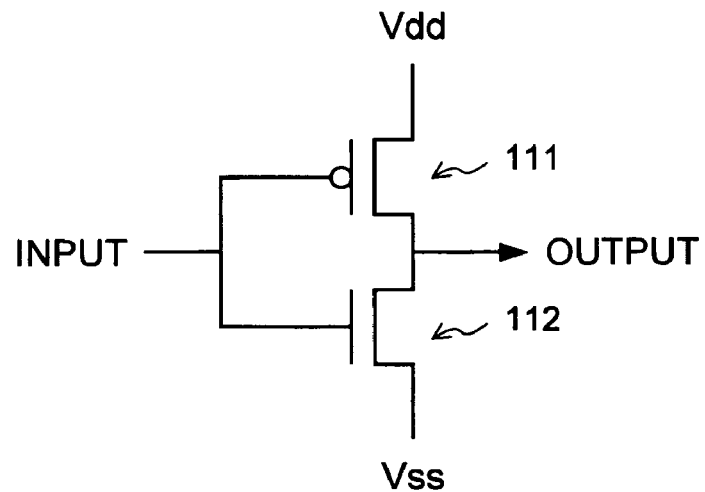
FIG. 15 is a circuit diagram of an inverter at a transistor level.
Figure 16:
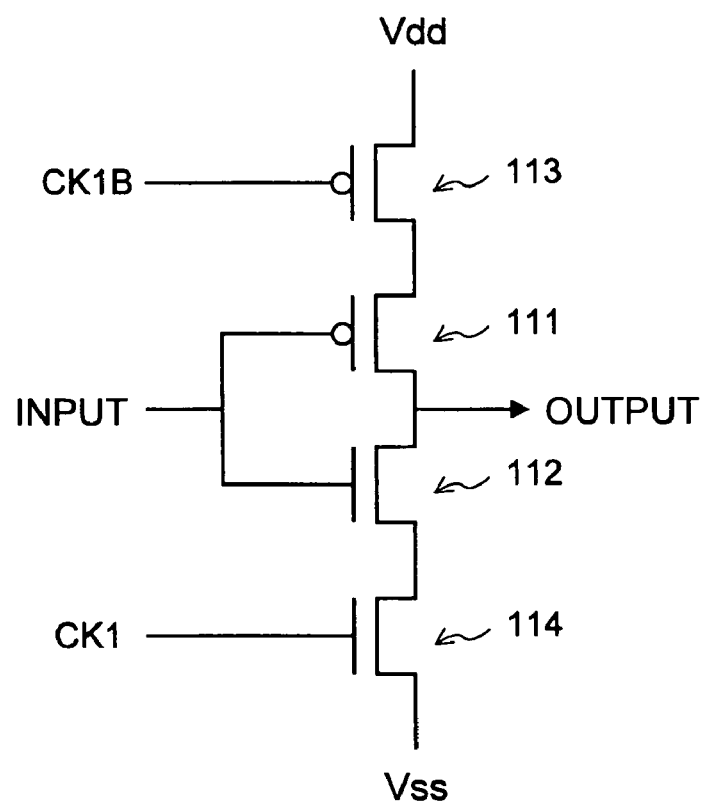
FIG. 16 is a circuit diagram of a clocked inverter, which operates by a clock signal, at a transistor level.
Figure 17:
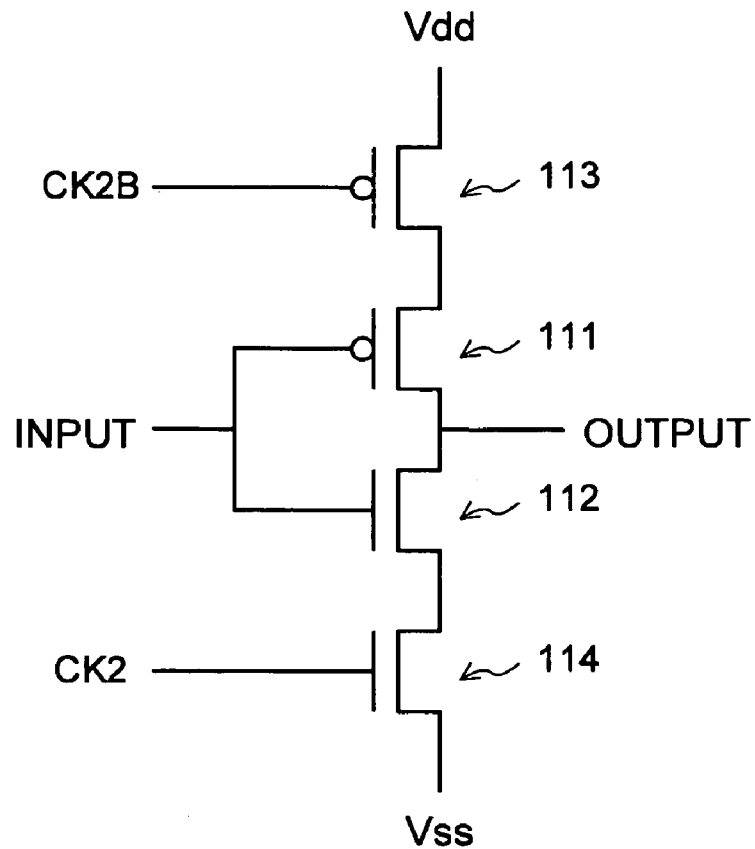
FIG. 17 is a circuit diagram of a clocked inverter, which operates by an inverted clock signal, at a transistor level.
Figure 18:
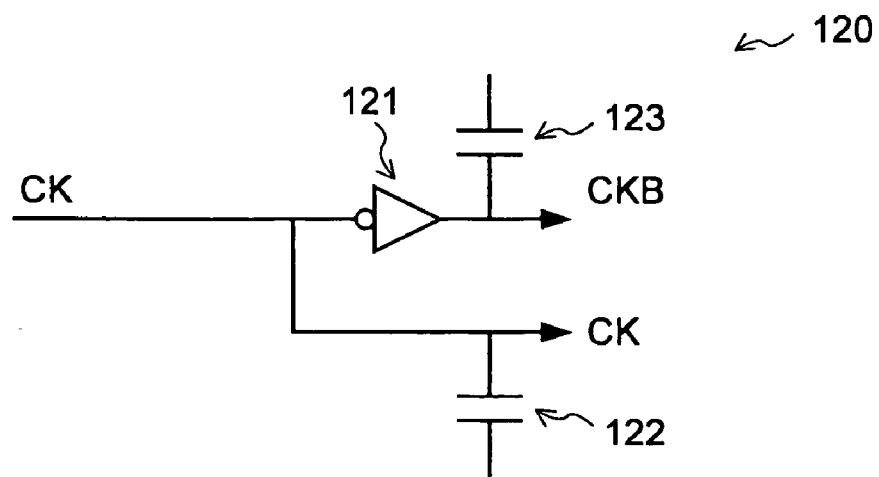
FIG. 18 is a circuit diagram of an inverted clock signal generating circuit.
Figure 19:
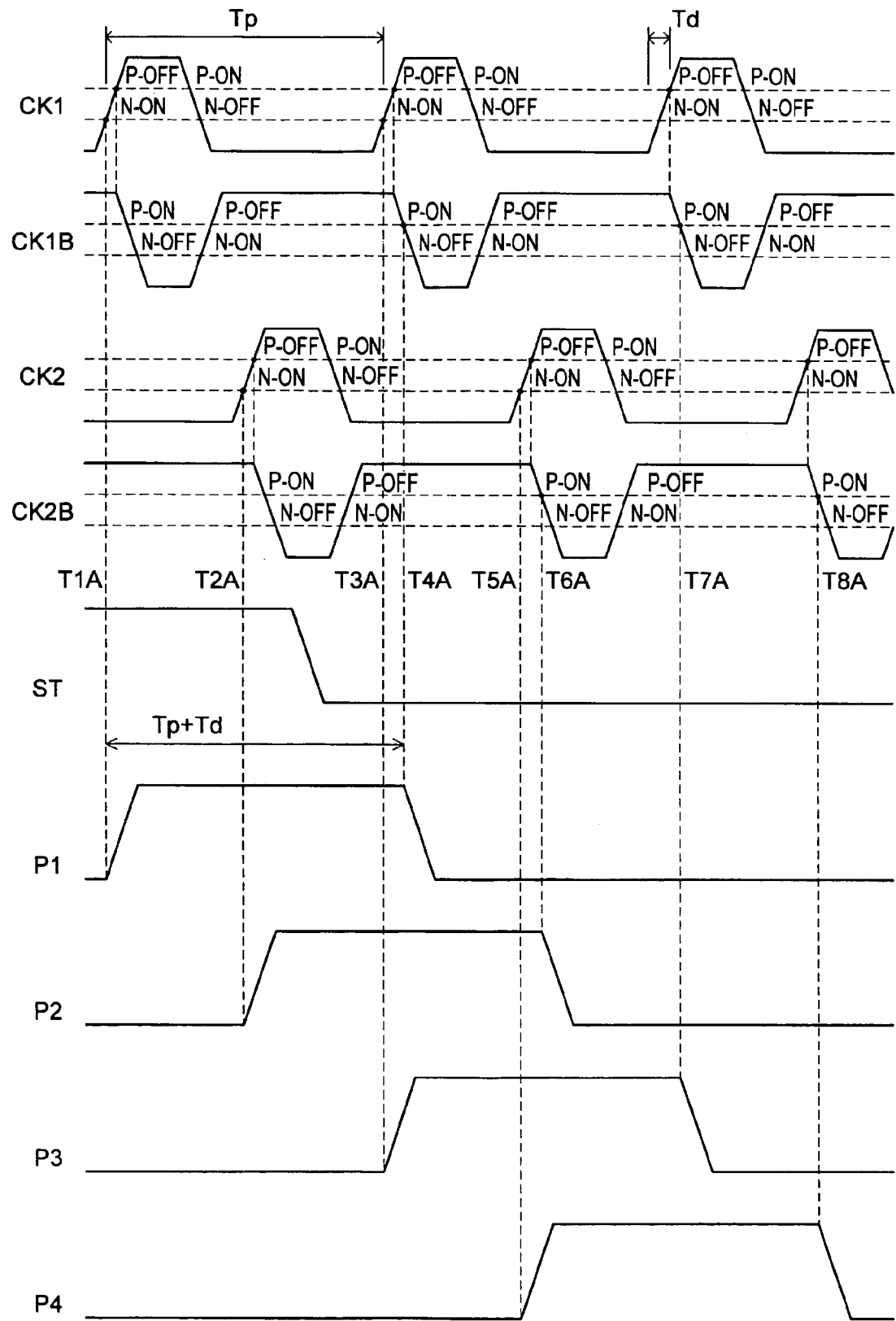
FIG. 19 is a timing chart when the bidirectional shift register is constituted in a positive logic.
Figure 20:
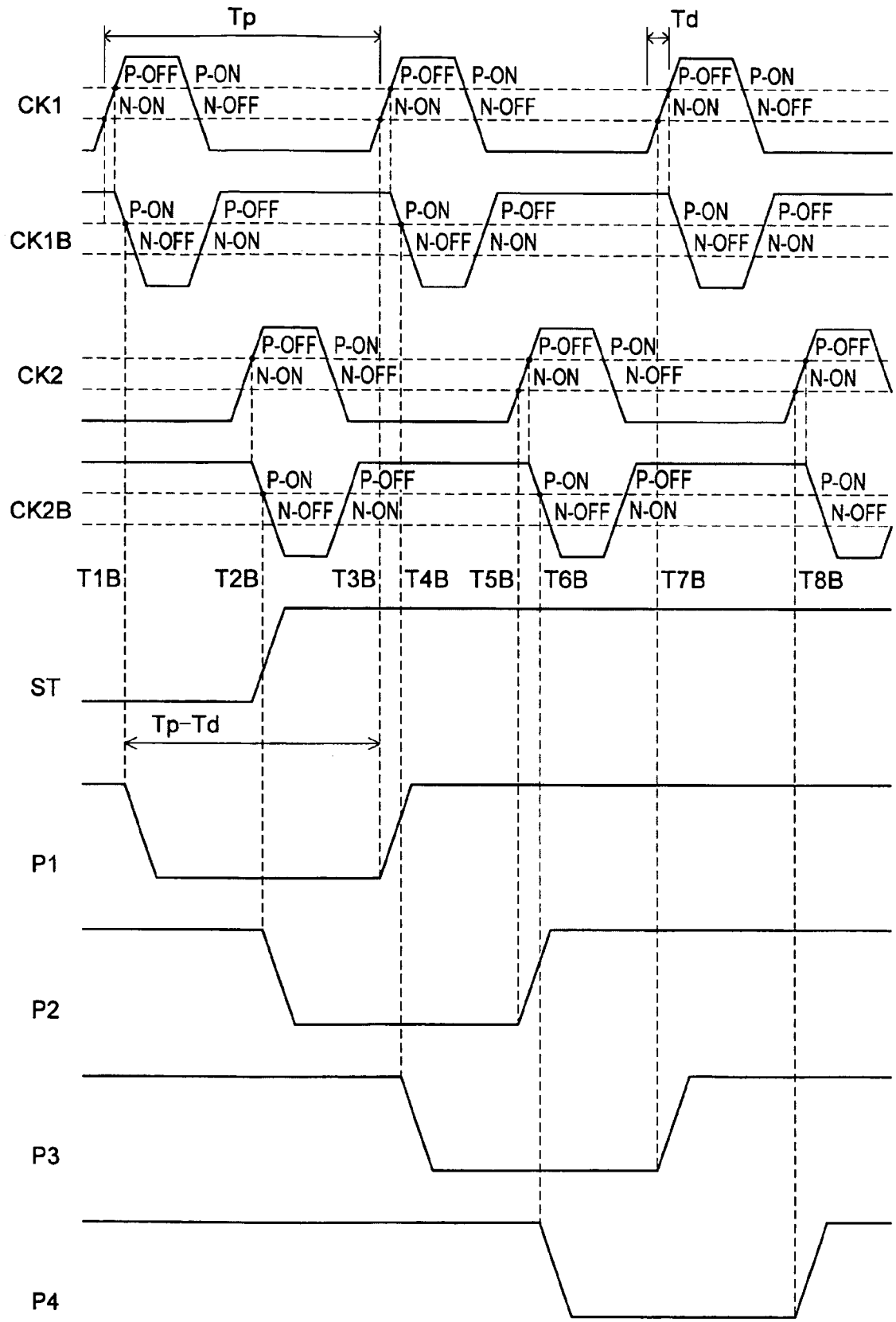
FIG. 20 is a timing chart when the bidirectional shift register is constituted in a negative logic.

FIG. 12 shows the configuration of a cellular phone, to which the electro-optical device 1 is applied. A cellular phone 3000 has a plurality of operating buttons 3001, scroll buttons 3002, and the electro-optical device 1 as a display unit. By operating the scroll buttons 3002, a screen displayed on the electro-optical device 1 is scrolled. FIG. 13 shows the configuration of a personal digital assistant (PDA), to which the electro-optical device 1 is applied. A personal digital assistant 4000 has a plurality of operating buttons 4001, a power supply switch 4002, and the electro-optical device 1 as a display unit. If the power supply switch 4002 is operated, various kinds of information, such as a directory or a scheduler, and the like, are displayed on the electro-optical device 1.

Moreover, as an electronic apparatus, to which the electro-optical device 1 is applied, in addition to the apparatuses shown in FIGS. 11 to 13, a digital still camera, a liquid crystal television, a viewfinder-type or monitor-direct-view-type video tape recorder, a car navigation device, a pager, an electronic organizer, an electronic calculator, a word processor, a workstation, a video phone, a POS terminal, an apparatus having a touch panel, or the like can be exemplified. Then, as display units of various electronic apparatuses, the above-described electro-optical device 1 can be applied.

What is claimed is:

1. A bidirectional shift register comprising:
   multi-stages of shift register unit circuits that transmit a start pulse in a direction indicated by a logical level of a transmission direction control signal,
   wherein each of the shift register unit circuits has:
   a first transfer gate that transmits the start pulse in synchronization with one of a clock signal and an inverted clock signal, the inverted clock signal being obtained by inverting the clock signal;
   a second transfer gate that transmits the start pulse in synchronization with the other signal of the clock signal and the inverted clock signal;
   a first logical circuit that inverts an input signal and outputs the inverted signal; and
   first and second clocked inverters that are exclusively valid according to the logical level of the transmission direction control signal,
   an output terminal of the first logical circuit is connected to input terminals of the first and second clocked inverters, and
   output terminals of the first and second clocked inverters are connected to an input terminal of the first logical circuit through the first and second transfer gates.

2. The bidirectional shift register according to claim 1, further comprising:
   a reset circuit that outputs a reset signal,
   wherein the first logical circuit is a NOR circuit that inverts a signal output from the first or second transfer gate and the reset signal and calculates a logical sum of the inverted signals.

3. The bidirectional shift register according to claim 1, further comprising:
   a reset circuit that outputs a reset signal,
   wherein the first logical circuit is a NAND circuit that inverts a signal output from the first or second transfer gate and the reset signal and calculates a logical product of the inverted signals.

* * * * *